(12) United States Patent
Senda et al.

(10) Patent No.: US 7,355,579 B2
(45) Date of Patent: Apr. 8, 2008

(54) DISPLAY

(75) Inventors: Michiru Senda, Gifu (JP); Ryoichi Yokoyama, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 715 days.

(21) Appl. No.: 10/838,341

(22) Filed: May 5, 2004

(65) Prior Publication Data

US 2004/0263468 A1    Dec. 30, 2004

(30) Foreign Application Priority Data

Jun. 30, 2003    (JP) .............................. 2003-186111

(51) Int. Cl.
*G09G 3/36* (2006.01)
(52) U.S. Cl. .................... 345/98; 345/99; 345/100; 345/204; 345/205
(58) Field of Classification Search .............. 345/98, 345/99, 100, 204, 205
See application file for complete search history.

(56) References Cited

U.S. PATENT DOCUMENTS

2003/0052848 A1*   3/2003   Yamaguchi .................. 345/87

FOREIGN PATENT DOCUMENTS

| EP | 1 160 796 A2 | 5/2001 |
|---|---|---|
| EP | 1 492 074 A2 | 6/2004 |
| JP | 1 160 796 A | * 5/2001 |

OTHER PUBLICATIONS

European Search Report for Corresponding Patent Application No. EP 04 25 2699, May 8, 2006.

* cited by examiner

*Primary Examiner*—Richard Hjerpe
*Assistant Examiner*—Leonid Shapiro
(74) *Attorney, Agent, or Firm*—McDermott Will & Emery LLP

(57) ABSTRACT

There is provided a display having a shift register circuit which can prevent an increase in power consumption. The display is provide with a shift register circuit including a first circuit part comprising a fourth transistor turned on in response to a first signal to supply a clock signal to a first transistor, and a second circuit part comprising an eighth transistor turned on in response to a second signal by which a period of on state which does not overlap with a period of on state of the fourth transistor can be obtained, to supply the clock signal to a fifth transistor.

17 Claims, 15 Drawing Sheets

DISPLAY

CROSS-REFERENCE TO RELATED APPLICATIONS

The priority application Number JP 2003-186111 upon which this patent application is based is hereby incorporated by reference.

BACKGROUND OF THE INVENTION

1. Field of the Invention Display

The present invention relates to a display and more particularly, it relates to a display provided with a shift register circuit.

2. Description of the Background Art

Conventionally, a resistance loading type of inverter circuit has been well known. This is disclosed in p.184-187 in "Basis of Semiconductor Devices" written by Seigo Kishino, published by Ohmsha, Ltd., Apr. 25 in 1985, for example. In addition, conventionally, a shift register circuit comprising the above-described resistance loading type of inverter circuit has been known. The shift register circuit is used as a circuit for driving a gate line or a drain line of a liquid crystal display or an organic EL display, for example.

FIG. 17 is a circuit diagram showing a shift register circuit comprising the conventional resistance loading type of inverter circuit. Referring to FIG. 17, a conventional shift register circuit 100a consists of a first circuit part 101a and a second circuit part 102a. A second stage of shift register circuit 100b consists of a first circuit part 101b and a second circuit part 102b.

The first circuit part 101a constituting the first stage of shift register circuit 100a comprises n-channel transistors NT101 and NT102, a capacitor C101, and a resistance R101. Hereinafter, the n-channel transistors NT101 and NT102 are referred to as the transistors NT101 and NT102, respectively in the description of the prior art. A source of the transistor NT101 is connected to a node ND101 and a start signal ST is input to a drain thereof. A clock signal CLK1 is supplied to a gate of the transistor NT101. In addition, a source of the transistor NT102 is connected to a negative-side potential VSS and a drain thereof is connected to anode ND102. In addition, one electrode of a capacitor C101 is connected to the node ND101 and the other electrode is connected to the negative-side potential VSS. In addition, one terminal of a resistance R101 is connected to a positive-side potential VDD and the other terminal is connected to the node ND102. Thus, the transistor NT102 and the resistance R101 constitute an inverter circuit.

In addition, a second circuit part 102a constituting the first stage of shift register circuit 100a comprises an n-channel transistor NT103 and a resistance R102. Hereinafter, the n-channel transistor NT103 is referred to as a transistor NT103 in the description of the prior art. A source of the transistor NT103 is connected to the negative-side potential VSS and a drain thereof is connected to a node ND103. One terminal of the resistance R102 is connected to the positive-side potential VDD and the other terminal is connected to the node ND103. Thus, the transistor NT103 and the resistance R102 constitute an inverter circuit.

In addition, the second or later stage of shift register circuit also has the same circuit constitution as that of the above-described first stage of shift register circuit 100a. In addition, it is constituted such that the first circuit part of the latter stage of shift register circuit is connected to the output node of the former stage of shift register circuit. In addition, the clock signal CLK1 is supplied to the gate of the transistor NT101 of the first circuit part arranged at the odd-numbered stage as described above, and a clock signal CLK2 is supplied to the gate of the transistor NT101 of the first circuit part arranged at the even-numbered stage.

FIG. 18 is a waveform chart for explaining an operation of the conventional shift register circuit shown in FIG. 17. A description is given the operation of the conventional shift register circuit with reference to FIGS. 17 and 18.

First, the start signal ST becomes H level. Then, a clock signal CLK1 becomes H level. Thus, since the clock signal CLK1 at H level is supplied to the gate of the transistor NT101 of the first stage of shift register circuit 100a, the transistor NT101 is turned on. Thus, since the potential of the node ND101 is raised to H level, the signal at H level is supplied to the gate of the transistor NT102. Therefore, the transistor NT102 is turned on. Thus, since the potential of the node ND 102 is lowered to L level, the transistor NT103 is turned off. Thus, the potential of the node ND103 is raised to H level, so that the output signal SR1 at H level is output from the first stage of shift register circuit 100a. In addition, while the clock signal CLK1 is at H level, the potential at H level is charged to the capacitor C101.

Then, the clock signal CLK1 becomes L level. Thus, in the first stage of shift register circuit 100a, the transistor NT101 is turned off. Then, the start signal ST becomes L level. Here, even when the transistor NT101 is turned off, since the potential of the node ND101 is held at H level by the potential at H level stored in the capacitor C101, the transistor NT102 is held in on state. Therefore, since the potential of the node ND102 is not raised to H level, the output signal at L level is kept supplied to the gate of the transistor NT103. Thus, since the transistor NT103 is kept in off state, the output signal SR1 at H level is kept output from the first stage of shift register circuit 100a.

Then, the clock signal CLK2 becomes H level. Thus, since the output signal SR1 at H level of the first stage of shift register circuit 100a is input to the second stage of shift register circuit 100b, the same operation as that of the first stage of shift register circuit 100a described above is performed. Therefore, the output signal SR2 at H level is output from the second stage of shift register circuit 100b.

Then, the clock signal CLK1 becomes H level again. Thus, in the first stage of shift register circuit 100a, the transistor NT101 is turned on. At this time, the potential of the node ND101 is lowered to L level because the start signal ST becomes L level. Thus, since the signal at L level is supplied to the gate of the transistor NT102, the transistor NT102 is turned off. Therefore, since the potential of the node ND102 is raised to H level, the transistor NT103 is turned on. As a result, since the potential of the node ND103 is lowered from H level to L level, the output signal SR1 at L level is output from the first stage of shift register circuit 100a. According to the above-described operation, output signals (SR1, SR2, SR3 . . . ) at H level whose timings are shifted are sequentially output from respective stages of shift register circuits.

However, according to the conventional shift register circuit shown in FIG. 17, when the output signal SR1 at H level is output in the first stage of shift register circuit 100a, since the transistor NT102 is held in on state, there has been a problem that a through-current flows between VDD and VSS through the resistance R101 and the transistor NT102. In addition, when the output signal SR1 at L level is output, since the transistor NT103 is held in on state, there has been a problem that the through-current flows between VDD and VSS through the resistance R102 and the transistor NT103.

Thus, there has been a problem that the through-current always flows between VDD and VSS. In addition, since the second and later stages of shift register circuits have the same constitution as that of the first stage of shift register circuit 100a, there has also been a problem that the through-current flows between VDD and VSS. Therefore, when the above conventional shift register circuit is used in a circuit for driving a gate line and a drain line of a liquid crystal display or an organic EL display, the power consumption in the liquid crystal display and the organic EL display is increased.

SUMMARY OF THE INVENTION

The present invention was made to provide a display including a shift register circuit which can prevent power consumption from being increased.

In order to solve the above problems, a display according to a first aspect of the present invention is provided with a shift register circuit including a first circuit part comprising a first conductive type of first transistor connected to a first potential side and turned on in response to a clock signal, a first conductive type of second transistor connected to a second potential side, a first conductive type of third transistor connected between a gate of the first transistor and the second potential, and a first conductive type of fourth transistor connected between a clock signal line and the gate of the first transistor and turned on in response to a first signal to supply the clock signal to the first transistor, and a second circuit part comprising a first conductive type of fifth transistor connected to the first potential side and turned on in response to the clock signal, a first conductive type of sixth transistor connected to the second potential side, a first conductive type of seventh transistor connected between a gate of the fifth transistor and the second potential and a first conductive type of eighth transistor connected between the clock signal line and the gate of the fifth transistor and turned on in response to a second signal by which a period of on state which does not overlap with a period of on state of the fourth transistor to which the first signal is input is obtained, to supply the clock signal to the fifth transistor.

In the display according to the first aspect, the fourth transistor of the first circuit part and the eighth transistor of the second circuit part are not turned on at the same time. In this case, since the third transistor and the fourth transistor are not turned on at the same time by turning off the third transistor when the forth transistor is in on state, the through-current is prevented from flowing between the second potential and the clock signal line through the third transistor and the fourth transistor. Furthermore, since the seventh transistor and the eighth transistor are not turned on at the same time by turning off the seventh transistor when the eighth transistor is in on state, the through-current is prevented from flowing between the second potential and the clock signal line through the seventh transistor and the eighth transistor. Furthermore, since the first transistor and the second transistor are not turned on at the same time by turning on the second transistor and turning off the first transistor when the third transistor is in on state, the through-current is prevented from flowing between the first potential and the second potential through the first transistor and the second transistor. Furthermore, the through-current is prevented from flowing between the first potential and the second potential through the fifth transistor and the sixth transistor by turning on the sixth transistor and turning off the fifth transistor when the seventh transistor is in on state. As a result, an increase in current consumption of the display comprising the shift register circuit can be prevented.

A display according to a second aspect of the present invention is provided with a shift register circuit connecting plural circuit parts each of which comprising a first conductive type of first transistor connected to a first potential side and turned on in response to a clock signal, a first conductive type of second transistor connected to a second potential side, a first conductive type of third transistor connected between a gate of the first transistor and the second potential and a first conductive type of fourth transistor connected between a clock signal line and the gate of the first transistor and turned on in response to a first signal so as to be turned on when the third transistor is in off state, to supply the clock signal to the first transistor.

In the display according to the second aspect, the third transistor and the fourth transistor are not turned on at the same time. Thus, the through-current is prevented from flowing between the second potential and the clock signal line through the third transistor and the fourth transistor. As a result, an increase of current consumption of the display comprising the shift register circuit can be prevented.

DESCRIPTION OF THE PREFERRED EMBODIMENTS

Hereinafter, embodiments of the present invention are described with reference to the drawings.

First Embodiment

Figure 1:
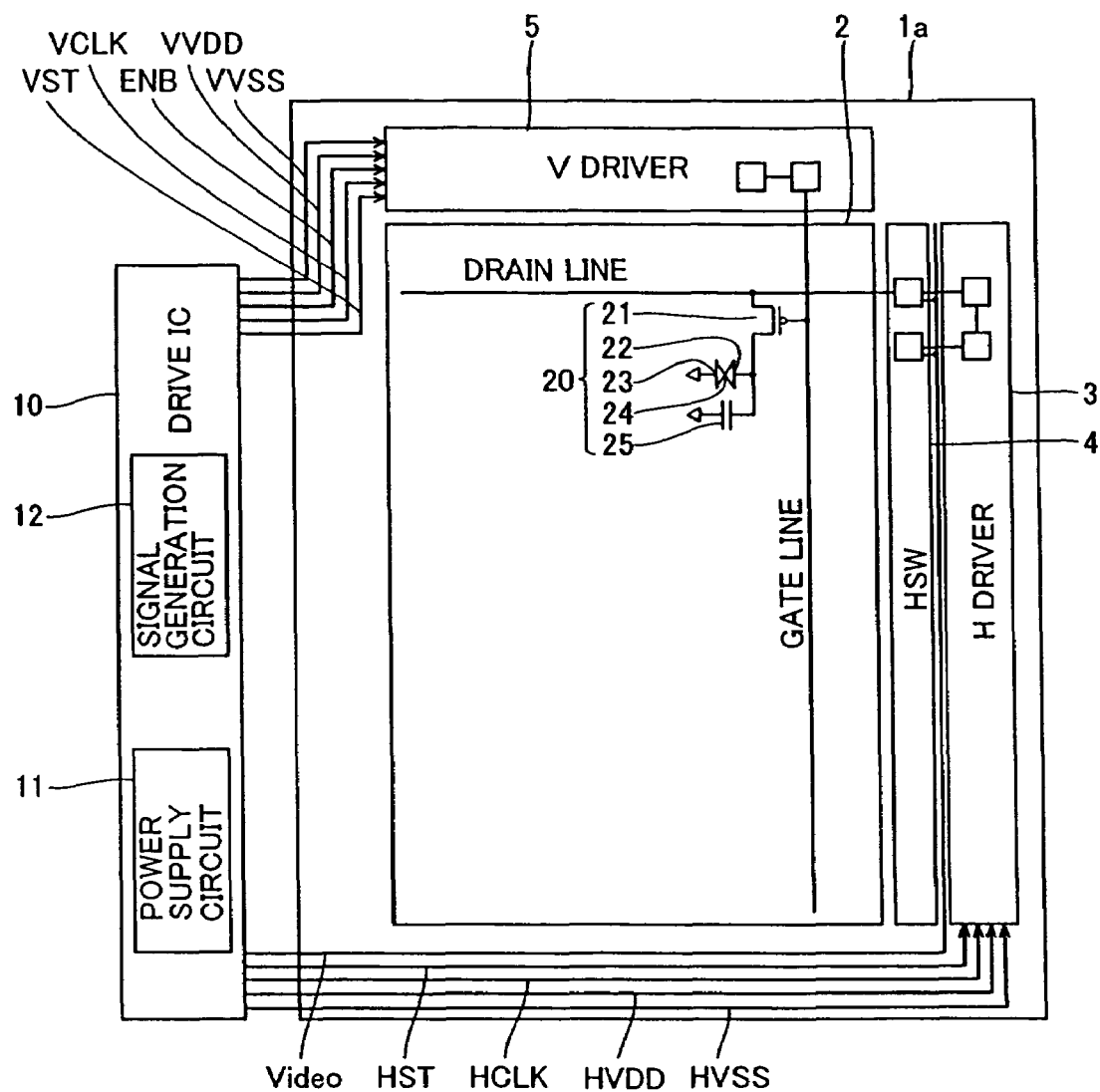
FIG. 1 is a plan view showing a liquid crystal display according to a first embodiment of the present invention.

Referring to FIG. 1, according to a first embodiment, a display part 2, an H driver 3, a horizontal switch (HSW) 4, and a V driver 5 are formed on a substrate 1a. A constitution for one pixel is shown in the display part 2 in FIG. 1. Although only two of the horizontal switches 4 are shown in FIG. 1, they are arranged by the number corresponding to the number of pixels. In addition, referring to the H driver 3 and the V driver 5, although only two shift registers constituting them are shown in FIG. 1, they are arranged by the number corresponding to the number of pixels. The H driver 3 and the horizontal switch 4 are provided for driving (scanning) a drain line and the V driver 5 is provided for driving (scanning) a gate line. In addition, pixels 20 are arranged in the shape of a matrix in the display part 2. Each of pixels 20 comprises a p-channel transistor 21, a pixel electrode 22, an opposite electrode 23 arranged so as to be opposed to the pixel electrode 22, which is common to each pixel 20, a liquid crystal 24 sandwiched between the pixel electrode 22 and the opposite electrode 23 and a subsidiary capacitance 25. A source of the p-channel transistor 21 is connected to the drain line and a drain thereof is connected to the pixel electrode 22 and one electrode of the subsidiary capacitance 25. A gate of the p-channel transistor 21 is connected to the gate line.

In addition, a drive IC10 is provided outside of the substrate 1a. This drive IC10 comprises a power supply circuit 11 and a signal generation circuit 12. A circuit for generating positive-side potentials HVDD and VVDD, and negative-side potentials HVSS and VVSS is provided in the power supply circuit 11. Thus, the positive-side potential HVDD and the negative-side potential HVSS are supplied to the H driver 3, and the positive-side potential VVDD and the negative-side potential VVSS are supplied to the V driver 5. In addition, the positive-side potentials HVDD and VVDD are an example of a "second potential" of the present invention and the negative-side potentials HVSS and VVSS are an example of a "first potential" of the present invention. In addition, in the signal generation circuit 12, there is provided a circuit for generating start signals HST and VST, clock signals HCLK and VCLK, and an enable signal ENB. Thus, the start signal HST and the clock signal HCLK are supplied to the H driver 3, and the start signal VST and the clock signal VCLK and the enable signal ENB are supplied to the V driver 5. In addition, a video signal Video is supplied from the drive IC10.

Figure 2:
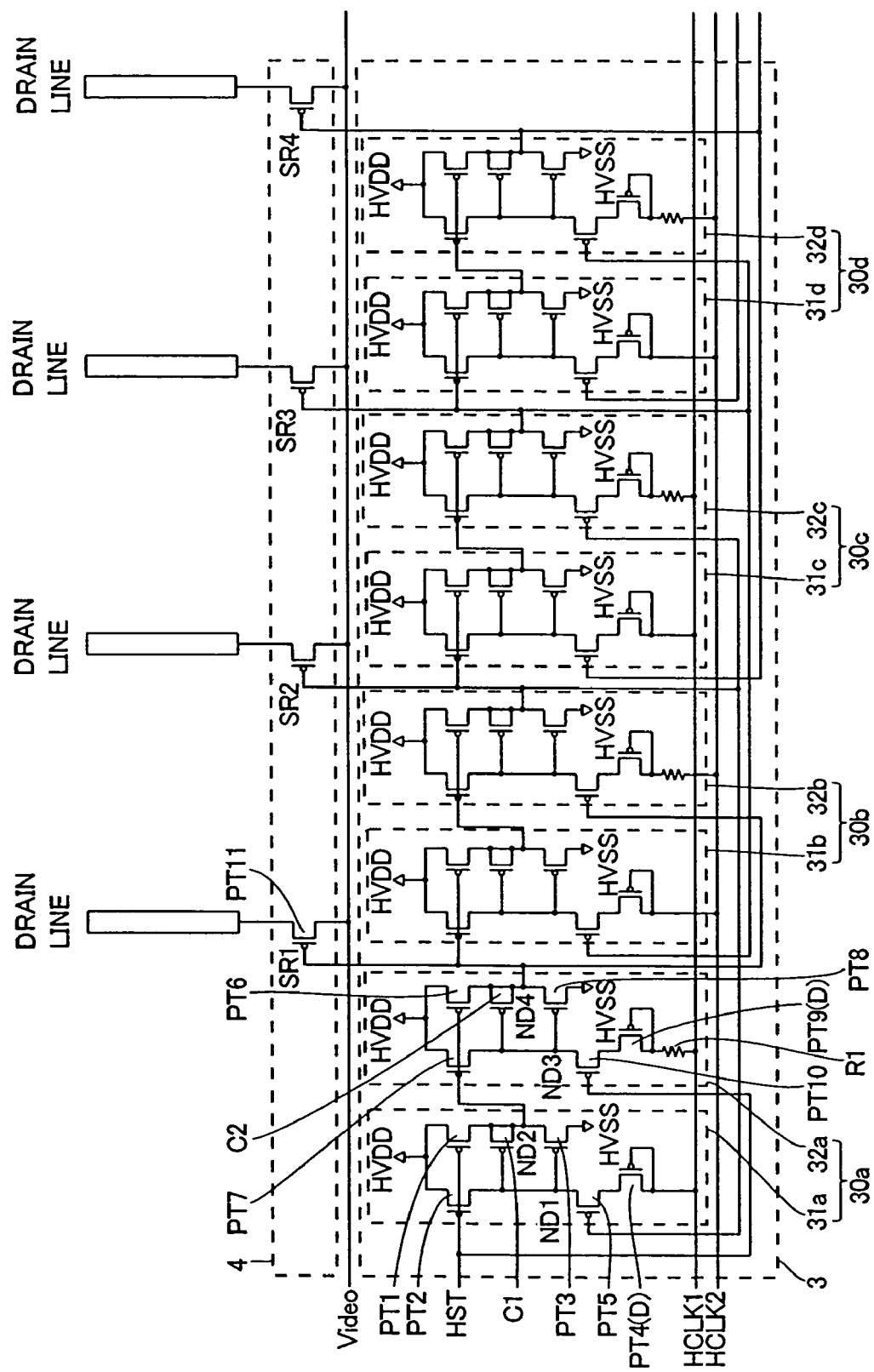
FIG. 2 is a circuit diagram showing a shift register circuit constituting an H driver of the liquid crystal display according to the first embodiment shown in FIG. 1.
Figure 3:
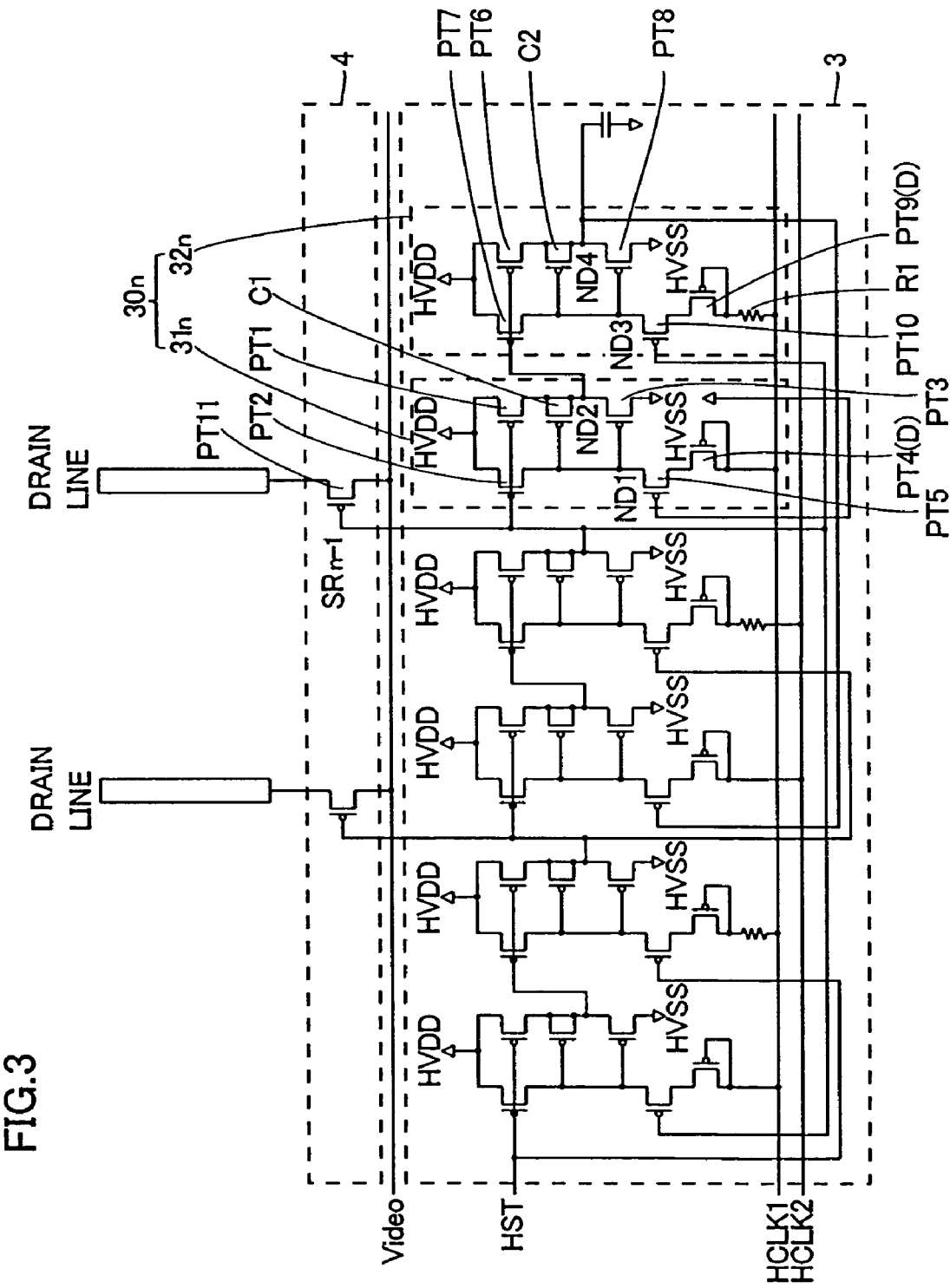
FIG. 3 is a circuit diagram of the last stage of shift register circuit shown in FIG. 2.

Next, a description is given of circuit constitutions of the H driver 3 and a horizontal switch 4 of a liquid crystal display according to the first embodiment with reference to FIGS. 2 and 3. The H driver 3 of the liquid crystal display according to the first embodiment consists of plural stages of shift register circuits 30a, 30b, 30c, 30d, . . . and $30_n$ comprising first circuit parts (31a, 31b, 31c, 31d, . . . and $31_n$) and second circuit parts (32a, 32b, 32c, 32d, . . . and $32_n$), respectively as shown in FIG. 2. In addition, the shift register circuits 30a, 30b, 30c, 30d, . . . and $30_n$ are provided in the H driver 3 by the number of stages corresponding to the number of the pixels.

Here, according to the first embodiment, the shift register circuits 30a, 30b, 30c, 30d, . . . and $30_n$ are constituted by TFTs (thin film transistor) comprising a plurality of p-type MOS transistors (field effect transistors). Hereinafter, the TFT comprising the p-type MOS transistor is simply referred to as the transistor in the first embodiment.

The first circuit part 31a constituting a first stage of shift register circuit 30a comprises transistors PT1, PT2, PT3, PT4 and PT5, and a capacitor C1 having a structure shorting out a source and a drain of the transistor. In addition, the transistor PT1 is an example of a "second transistor" of the present invention, and the transistor PT2 is an example of a "third transistor" of the present invention. In addition, the transistor PT3 is an example of a "first transistor" of the present invention, and the transistor PT4 is an example of a "first diode" and a "ninth transistor" of the present invention. Furthermore, the transistor PT5 is an example of a "fourth transistor" of the present invention, and the capacitor C1 is an example of "first capacitor" of the present invention.

A source of the transistor PT1 is connected to the positive-side potential HVDD, and a drain thereof is connected to a node ND2. A source of the transistor PT2 is connected to the positive-side potential HVDD and a drain thereof is connected to a node ND1. The start signal HST is supplied to gates of the transistors PT1 and PT2. In addition, the start signal HST is an example of a "second signal" of the present invention. In addition, the transistor PT2 is provided in order to turn off the transistor PT3 by supplying a signal at H level to a gate of the transistor PT3 when the transistor PT1 is in on state.

Furthermore, a source of the transistor PT3 is connected to the node ND2 and a drain thereof is connected to the negative-side potential HVSS. A gate of the transistor PT3 is connected to the node ND1.

Here, according to the first embodiment, the capacitor C1 is connected between the gate and the source of the transistor PT3. In addition, a source of the transistor PT4 is connected to the node ND1 side and a drain thereof is connected to the clock signal (HCLK1). The transistor PT4 is diode-connected.

Still further, according to the first embodiment, the transistor PT5 is connected between the transistor PT4 and the node ND1. In other words, a source of the transistor PT5 is connected to the node ND1 and a drain thereof is connected to the source of the transistor PT4. An output signal SR2 of the next stage of shift register circuit 30b is supplied to a gate of the transistor PT5. In addition, the output signal SR2 of the next stage of shift register circuit 30b is an example of a "first signal" of the present invention.

Still further, the second circuit part 32a constituting the first stage of shift register circuit 30a comprises transistors PT6, PT7, PT8, PT9 and PT10, a capacitor C2 having a structure shorting out the source and the drain of the transistor, and a resistance R1. In addition, the transistor PT6 is an example of a "sixth transistor" of the present invention, and the transistor PT7 is an example of a "seventh transistor" of the present invention. In addition, the transistor PT8 is an example of a "fifth transistor" of the present invention and the transistor PT9 is an example of the "second diode" and a "tenth transistor" of the present invention. Furthermore, the transistor PT10 is an example of an "eighth transistor" of the present invention and the capacitor C2 is an example of a "second capacitor" of the present invention. In addition, the resistance R1 is an example of a "high resistance" of the present invention.

A source of the transistor PT6 is connected to the positive-side potential HVDD, and a drain thereof is connected to a node ND4. A source of the transistor PT7 is connected to the positive-side potential HVDD and a drain thereof is connected to a node ND3. Gates of the transistors PT6 and PT7 are connected to the node ND2 of the first circuit part 31a. In addition, the transistor PT7 is provided in order to turn off the transistor PT8 by supplying a signal at H level to a gate of the transistor PT8 when the transistor PT6 is in on state.

Furthermore, a source of the transistor PT8 is connected to the node ND4 and a drain thereof is connected to the negative-side potential HVSS. A gate of the transistor PT8 is connected to the node ND3.

Here, according to the first embodiment, the capacitor C2 is connected between the gate and the source of the transistor PT8. In addition, a source of the transistor PT9 is connected to the node ND3 side and a drain thereof is connected to a clock signal line (HCLK1) side. The transistor PT9 is diode-connected.

Still further, according to the first embodiment, the transistor PT10 is connected between the transistor PT9 and the node ND3. In other words, a source of the transistor PT10 is connected to the node ND3 and a drain thereof is connected to the source of the transistor PT9. The start signal HST is supplied to a gate of the transistor PT10. In addition, the resistance R1 is connected between the transistor PT9 and the clock signal line (HCLK1). The resistance R1 is provided for slowing response speed when the transistors PT8 and PT9 are turned on.

Second and later stages of shift register circuits 30b, 30c, 30d, . . . and $30_n$ have the same circuit constitution as that of the above first shift register circuit 30a. That is, the second or later stages of 30b, 30c, 30d, . . . and $30_n$ each comprise first circuit parts 31b, 31c, 31d, . . . and $31_n$ and second circuit parts 32b, 32c, 32d, . . . and $32_n$, respectively which have the same circuit constitution as the first circuit part 31a and the second circuit part 32a of the first stage of shift register circuit 30a.

Here, according to the first embodiment, the output signal (the first signal) of the next stage of shift register is supplied to the gate of the predetermined stage (except for the last stage) of transistor PT5, and the output signal of the former stage shift register or the start signal HST (the second signal) is supplied to the gate of transistor PT10.

In addition, as shown in FIG. 3, a gate of the transistor PT5 of the last stage of shift register $30_n$ is connected to the negative-side potential HVSS. Therefore, the signal at L level is constantly supplied to the gate of the transistor PT5 of the last stage of shift register circuit $30_n$.

Furthermore, as shown in FIG. 2, a transistor PT11 is provided in the horizontal switch 4 at each stage. A source of the transistor PT11 is connected to a video signal line Video and a drain thereof is connected to a drain line. In addition, a gate of the transistor PT11 at each stage is connected to the node 4 which is the output node at each stage. Thus, the output signals of the respective stages (SR1, SR2, SR3, SR4, . . . and $SR_{n-1}$) are supplied to the respective stages of transistors PT11. In addition, each of the output signals (SR1, SR2, SR3, SR4, . . . and $SR_{n-1}$) is input to each of the sources of the horizontal switches 4 provided depending on the number of video signal lines (when three kinds of video signals such as red (R), green (G) and blue (B) are input, the number is three).

Figure 4:
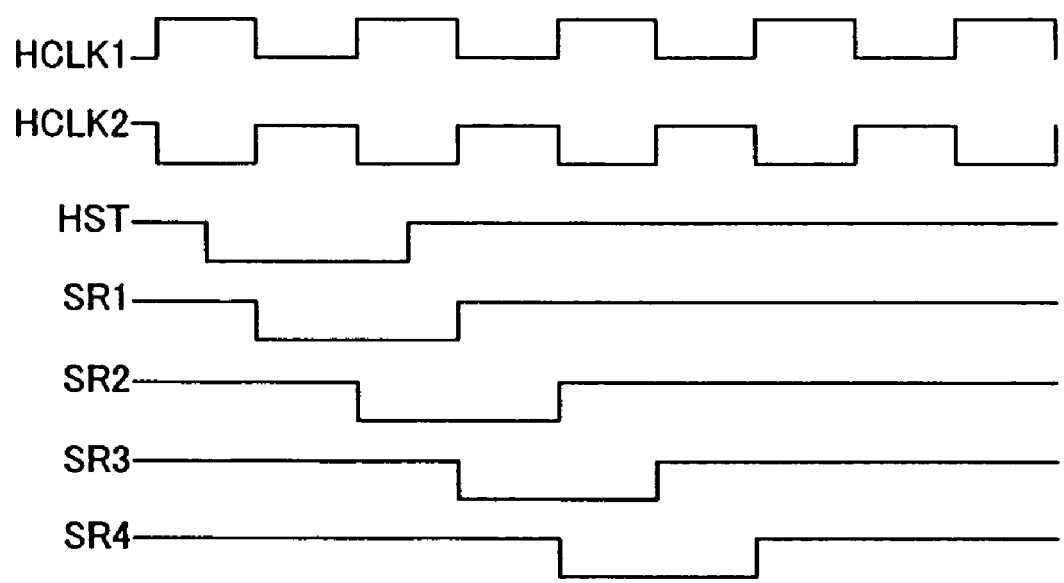
FIG. 4 is a waveform chart for explaining operations of the H driver and a horizontal switch shown in FIGS. 2 and 3.

Next, a description is given of operations of the H driver 3 and the horizontal switch 4 of the liquid crystal display according to the first embodiment with reference to FIGS. 2 to 4.

First, in an initial state, the output signals SR1 to $SR_{n-1}$ of the first to (n−1) th stages of shift register circuits 30a to $30_{n-1}$ are at H level.

In this state, when the start signal HST becomes L level, the start signal HST at L level is supplied to the transistors PT1 and PT2 of the first stage of shift register circuit 30a, whereby the transistors PT1 and PT2 are turned on. Then, the clock signal HCLK1 becomes L level and the clock signal HCLK2 becomes H level, whereby the clock signal HCLK1 at L level is supplied to the gates of the transistors PT4 and PT9 of the first stage of shift register 30a. Thus, the transistors PT4 and PT9 are turned on. In addition, response speed when the transistor PT9 is turned on is slowed by the resistance R1.

At this time, according to the first embodiment, since the output signal SR2 at H level of the second stage of shift register circuit 30b is supplied to the gate of the transistor PT5 of the first stage of shift register 30a, the transistor PT5 is turned off. Therefore, even when the transistors PT2 and PT4 are in on states, a through-current does not flow to the clock signal line (HCLK1) from the HVDD through the transistors PT2 and PT4.

Furthermore, since the transistor PT2 of the first stage of shift register 30a is in on state and the transistor PT5 is in off state, the potential of the node ND1 is raised to H level, whereby the transistor PT3 is turned off. In this case, since the transistor PT1 is in on state, the potential of the node ND 2 is raised to H level, whereby the transistors PT6 and PT7 are turned off.

At this time, according to the first embodiment, since the start signal HST at L level is supplied to the gate of the transistor PT10 of the first stage of shift register circuit 30a, the transistor PT10 is in on state. Thus, since the potential of the node ND3 is lowered to L level, the transistor PT8 is turned on. In this state, since the transistor PT6 is in off state, the potential of the node ND4 is lowered to the HVSS side.

At this time, the potential of the node ND3 of the first stage of shift register circuit 30a is lowered in accordance with the lowering of the potential of the node ND4 such that the voltage between the gate and the source of the transistor PT8 may be maintained by the capacitor C2. In addition, since the transistor PT7 is in off state and the clock signal HCLK1 at H level from the clock signal line does not flow back to the node ND3 in the diode-connected transistor PT9, the voltage held by the capacitor C2 (voltage between the gate and the source of the transistor PT8) is maintained. Thus, since the transistor PT8 is constantly held in on state, the potential of the node ND4 is lowered to the HVSS. As a result, the output signal SR1 at L level is output from the first stage of shift register circuit 30a.

Then, since the output signal SR1 at L level from the first stage of shift register circuit 30a is supplied to the gate of the first stage of transistor PT11 of the horizontal switch 4, the first stage of transistor PT11 is turned on. In addition, the output signal SR1 at L level is also supplied to the second stage of shift register circuit 30b.

Then, the clock signal HCLK1 becomes H level and the clock signal HCLK2 becomes L level, whereby the transistors PT4 and PT9 of the first stage of shift register circuit 30a are turned off. Then, the start signal HST becomes H level, whereby the transistors PT1 and PT2 and PT10 are turned off. In this case, the nodes ND1 and ND2 become a floating state while held at H level. In addition, the potential of the node ND4 is held at the HVSS (L level) by the off-state transistor PT9 and the capacitor C2. Thus, the output signal SR1 at L level is kept output from the first stage of shift register circuit 30a.

At this time, since the output signal SR1 at L level of the first stage of shift register circuit 30a and the clock signal HCLK2 are supplied to the first circuit part 31b of the second stage of shift register circuit 30b, in the second stage of shift register circuit 30b, the same operation as the above-described operation is performed when the start signal HST at L level and the clock signal HCLK1 at L level are supplied to the first stage of shift register circuit 30a. Thus, the output signal SR2 at L level is output from the second stage of shift register circuit 30b.

Then, when the clock signal HCLK1 becomes L level and the clock signal HCLK2 becomes H level again, the transistors PT4 and PT9 of the first stage of shift register circuit 30a are turned on.

At this time, according to the first embodiment, since the output signal SR2 at L level of the second stage of shift register circuit 30b is supplied to the gate of the transistor PT5 of the first stage of shift register circuit 30a, the transistor PT5 is turned on. Thus, since the transistor PT3 is turned on, the node ND2 becomes L level. As a result, the transistors PT6 and PT7 are turned on.

At this time, according to the first embodiment, since the start signal HST at H level is supplied to the gate of the transistor PT10 of the first stage of shift register circuit 30a, the transistor PT10 is turned off. Therefore, even when the transistors PT7 and PT9 are in on states, a through-current does not flow into the clock signal line (HCLK1) from the HVDD through the transistors PT7 and PT9.

In addition, since the transistor PT7 is in on state and the transistor PT10 is in off state in the first stage of shift register circuit 30a, the potential of the node ND3 is raised to H level. Thus, since the transistor PT8 is turned off, the potential of the node ND4 is raised to the HVDD. As a result, the output signal SR1 at H level is output from the first stage of shift register circuit 30a.

As described above, in the shift register circuit 30a according to the first embodiment, when the clock signal HCLK1 at L level is input while the start signal HST at L level is input to the first circuit part 31a, the output signal SR1 at L level is output from the second circuit part 32a. When the clock signal HCLK1 at L level is input again while the output signal SR1 at L level is output from the second circuit part 32a, the output signal SR1 from the second circuit part 32a becomes H level. Then, the output signal ST1 from the second circuit part 32a of the first stage of shift register circuit 30a is input to the first circuit part 31b of the second stage of shift register circuit 30b. Thus, since the output signal from the former stage of shift register circuit is input to the next stage of shift register circuit, and the clock signals HCLK1 and LCLK2 whose timings are shifted to each other are alternately input to each stage of shift register circuit, the timing at which the output signal at L level is output from each stage of shift register circuit is shifted.

Thus, the drain line of the liquid crystal display according to the first embodiment is driven (scanned). When scanning for all stages of drain lines connected to one gate line is finished, the next gate line is selected. Then, each stage of drain line is sequentially scanned and then the next gate line is selected. This operation is repeated until scanning of the last gate line is completed, whereby scanning for one screen is finished.

In addition, as shown in FIG. 3, the signal at L level is constantly supplied to the gate of the transistor PT5 of the last stage of shift register circuit $30_n$. Therefore, the transistor PT5 of the last stage of shift register circuit $30_n$ is constantly in on state.

According to the first embodiment, as described above, since the transistor PT5 which is turned on in response to the next stage of output signal $SR_{m+1}$ to supply the clock signal HCLK1 (HVLK2) to the transistor PT3, and the transistor PT10 which is turned on in response to the former stage of output signal $SR_{m-1}$ or the start signal HST to supply the clock signal HCLK1 (HCLK2) are provided, a period at L level of the next stage of output signal $SR_{m+1}$ and a period at L level of the former stage of output signal $SR_{m-1}$ (on states of the transistors PT5 and PT10) do not overlap with each other. As a result, the transistor PT5 and the transistor PT10 are not turned on at the same time. Since the transistor PT2 is turned on in response to the former stage of output signal $SR_{m-1}$ or the start signal HST, the transistor PT5 and the transistor PT2 are not turned on at the same time. Therefore, the through-current can be prevented from flowing between the HVDD and the clock signal line through the transistor PT5 and the transistor PT2. In addition, since the transistor PT7 is in off state while the transistor PT10 which is turned on in response to the former stage of output signal $SR_{m-1}$ or the start signal HST is in on state, the transistor PT10 and the transistor PT7 are not turned on at the same time. Therefore, the through-current can be prevented from flowing between the HVDD and the clock signal line through the transistor PT10 and the transistor PT7.

In addition, when the transistor PT2 is in on state, the transistor PT1 is turned on and the transistor PT3 is turned off, so that the transistor PT1 and the transistor PT3 are not turned on at the same time. Therefore, the through-current can be prevented from flowing between the HVDD and the HVSS through the transistors PT1 and PT3. In addition, when the transistor PT7 is in on state, the transistor PT6 is turned on and the transistor PT8 is turned off, so that the through-current can be prevented from flowing between the HVDD and the HVSS through the transistors PT6 and PT8. As a result, the current consumption of the H driver 3 of the liquid crystal display is prevented from being increased.

Furthermore, according to the first embodiment, since the diode-connected transistors PT4 and PT9 are provided, even when the diodes (transistors PT4 and PT9) are provided, the shift register circuit can be constituted by p-channel transistors only, the number of ion implantations and the number of implantation masks are not increased. Thus, the manufacturing processes are prevented from becoming complex and the manufacturing cost can be prevented from being increased.

Still further, according to the first embodiment, since all of the transistors constituting the shift register circuit are p-channel transistors, it is not necessary to provide a LDD structure in the p-channel transistor unlike the n-channel transistor. Consequently, the manufacturing process can be further simplified.

In addition, according to the first embodiment, since the resistance R1 is connected between the transistor PT9 and the clock signal line, the response speed when the transistor PT8 is turned on is slowed and the signal output from the shift register circuit when the transistor PT8 is in on state can be delayed. In this case, when it is assumed that the transistor PT8 of the first stage of shift register circuit 30a is turned off while the transistor PT8 of the third stage of shift register circuit 30c is in on state, the response speed of the transistor PT11 corresponding to the third stage of shift register circuit 30c is slowed and the transistor PT11 corresponding to the first stage of shift register circuit 30a is quickened. Thus, the moment when the third stage of transistor PT11 is switched from off stage to on stage can be prevented from overlapping with the moment when the first stage of transistor PT11 is switched from on state to off state. Therefore, since the third stage of transistor PT11 can be turned on after the first stage of transistor PT11 was turned off, the problem that a noise is generated in a picture signal because the third stage of transistor PT11 is turned on at the moment the first stage of transistor PT11 is switched from on state to off state can be prevented. Thus, picture deterioration caused by the noise can be prevented.

Second Embodiment

According to a second embodiment, a description is given of a case where the present invention is applied to the V driver 5 for driving (scanning) the gate line in the liquid crystal display of the first embodiment shown in FIG. 1.

Figure 5:
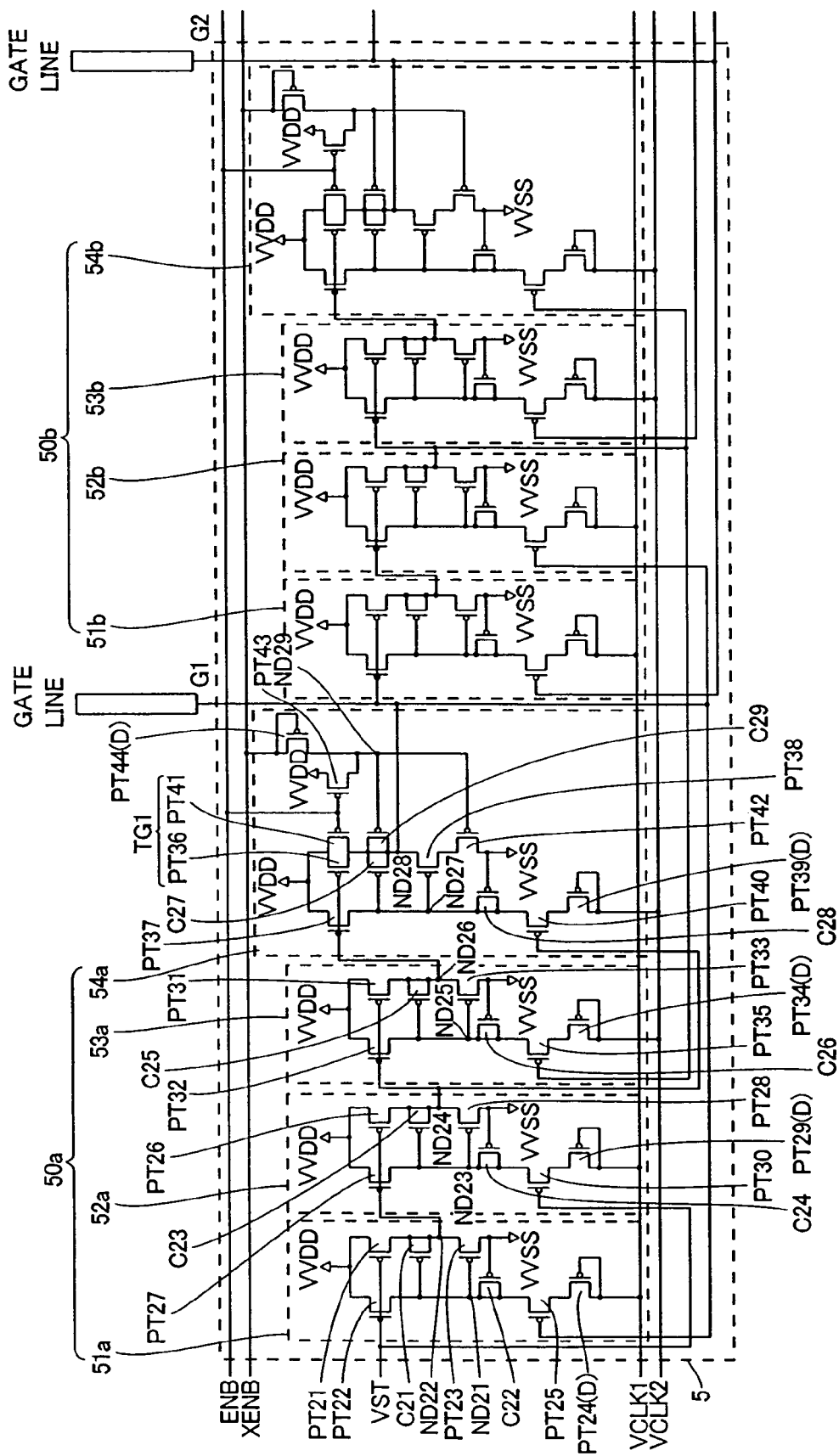
FIG. 5 is a circuit diagram showing a shift register circuit constituting a V driver of a liquid crystal display according to a second embodiment of the present invention.

More specifically, the V driver 5 of the liquid crystal display according to the second embodiment consists of plural stages of shift register circuits 50a, 50b, 50c, 50d, . . . and $50_n$ comprising first circuit parts (51a, 51b, 51c, 51d, . . . and $51_n$), second circuit parts (52a, 52b, 52c, 52d, . . . and $52_n$), third circuit parts (53a, 53b, 53c, 53d, . . . and $53_n$), and fourth circuit parts (54a, 54b, 55c, 55d, . . . and $55_n$), respectively as shown in FIG. 5, respectively. In addition, the third circuit parts 53a to $53_n$ are an example of a "first circuit part" of the present invention and the fourth circuit parts 54a to $54_n$ are an example of a "second circuit part" of the present invention.

Here, according to the second embodiment, the shift register circuits 50a, 50b, 50c, 50d, . . . and $50_n$ are constituted by TFTs (thin film transistors) comprising a plurality of p-type MOS transistors (field effect transistors). Hereinafter, the TFT comprising the p-type MOS transistor is simply referred to as the transistor in the second embodiment.

The first circuit part 51a constituting the first stage of shift register circuit 50a comprises transistors PT21, PT22, PT23, PT24 and PT25, and capacitors C21 and C22 having a structure shorting out the source and the drain of the transistor. In addition, the transistor PT21 is an example of the "second transistor" of the present invention, the transistor PT22 is an example of the "third transistor" of the present invention. In addition, the transistor PT23 is an example of the "first transistor" of the present invention and the transistor PT24 is an example of the "first diode" and a "ninth transistor" of the present invention. Furthermore, the transistor PT25 is an example of the "fourth transistor" of the present invention and the capacitor C21 is an example of the "first capacitor" of the present invention.

A source of the transistor PT21 is connected to the positive-side potential VVDD, and a drain thereof is connected to a node ND22. A source of the transistor PT22 is connected to the positive-side potential VVDD and a drain thereof is connected to a node ND21. The start signal VST is supplied to gates of the transistors PT21 and PT22. In addition, the start signal VST is an example of the "second signal" of the present invention. The transistor PT22 is provided in order to turn off the transistor PT23 by supplying a signal at H level to a gate of the transistor PT23 when the transistor PT21 is in on state.

Furthermore, a source of the transistor PT23 is connected to the node ND22 and a drain thereof is connected to the negative-side potential VVSS. A gate the transistor PT23 is connected to the node ND21.

Here, according to the second embodiment, the capacitor C21 is connected between the gate and the source of the transistor PT23. In addition, a source of the transistor PT24 is connected to the node ND21 side and a drain thereof is connected to a clock signal line (VCLK1). The transistor PT24 is diode-connected.

Still further, according to the second embodiment, the transistor PT25 is connected between the transistor PT24 and the node ND21. In other words, a source of the transistor PT25 is connected to the node ND21 and a drain thereof is connected to the source of the transistor PT24. An output signal of the fourth circuit part 54a of the same stage of shift register circuit 50a is supplied to a gate of the transistor PT25. In addition, the output signal of the fourth circuit part 54a of the same stage of shift register circuit 50a is an example of the "first signal" of the present invention.

In addition, the capacitor C22 is connected between the gate and the drain of the transistor PT23. The capacitor C22 is provided in order to prevent the transistor PT23 from malfunctioning because the potential of the node ND21 is lowered too much when the transistor PT25 is switched from off state to on state. In addition, since the V shift resister 5 for driving (scanning) the gate line in the second embodiment is slow in operation speed as compared with that of the H shift register 3 in the above first embodiment, the potential of the node ND21 is likely to become unstable. Therefore, the capacitor C22 is provided in the V shift register 5.

In addition, the second circuit part 52a constituting the first stage of shift register circuit 50a has the same circuit constitution as that of the first circuit part 51a basically. More specifically, the second circuit part 52a comprises transistors PT26, PT27, PT28, PT29 and PT30, and capacitors C23 and C24 having a structure shorting out the source and the drain of the transistor. In addition, the transistor PT26 is an example of the "sixth transistor" of the present invention, the transistor PT27 is an example of the "seventh transistor" of the present invention. In addition, the transistor PT28 is an example of the "fifth transistor" of the present invention and the transistor PT29 is an example of the "second diode" and a "tenth transistor" of the present invention. Furthermore, the transistor PT30 is an example of the "eighth transistor" of the present invention and the capacitor C23 is an example of the "second capacitor" of the present invention.

A source of the transistor PT26 is connected to the positive-side potential VVDD, and a drain thereof is connected to a node ND24. A source of the transistor PT27 is connected to the positive-side potential VVDD and a drain thereof is connected to a node ND23. Gates of the transistors PT26 and PT27 are connected to the node ND22 of the first circuit part 51a. In addition, the transistor PT27 is provided in order to turn off the transistor PT28 by supplying a signal at H level to a gate of the transistor PT28 when the transistor PT26 is in on state.

Furthermore, a source of the transistor PT28 is connected to the node ND24 and a drain thereof is connected to the negative-side potential VVSS. The gate of the transistor PT28 is connected to the node ND23.

Here, according to the second embodiment, the capacitor C23 is connected between the gate and the source of the transistor PT28. In addition, a source of the transistor PT29 is connected to the node ND23 side and a drain thereof is connected to a clock signal line (VCLK1). The transistor PT29 is diode-connected.

Still further, according to the second embodiment, the transistor PT30 is connected between the transistor PT29 and the node ND23. In other words, a source of the transistor PT30 is connected to the node ND23 and a drain thereof is connected to the source of the transistor PT29. The start signal VST is supplied to a gate of the transistor PT30.

In addition, the capacitor C24 is connected between the gate and the drain of the transistor PT28. The capacitor C24 is provided in order to prevent malfunction of the transistor PT28 caused by too much lowering of the potential of the node ND23 when the transistor PT30 is switched from off state to on state.

In addition, the third circuit part 53a constituting the first stage of shift register circuit 50a has the same circuit constitution as that of the first circuit part 51a and second circuit part 52a basically. More specifically, the third circuit part 53a comprises transistors PT31, PT32, PT33, PT34 and PT35, and capacitors C25 and C26 having a structure shorting out the source and the drain of the transistor. In addition, the transistor PT31 is an example of the "second transistor" of the present invention, the transistor PT32 is an example of the "third transistor" of the present invention. In addition, the transistor PT33 is an example of the "first transistor" of the present invention and the transistor PT34 is an example of the "first diode" and the "ninth transistor" of the present invention. Furthermore, the transistor PT35 is an example of the "fourth transistor" of the present invention and the capacitor C25 is an example of the "first capacitor" of the present invention.

A source of the transistor PT31 is connected to the positive-side potential VVDD, and a drain thereof is connected to a node ND26. A source of the transistor PT32 is connected to the positive-side potential VVDD and a drain thereof is connected to a node ND25. Gates of the transistors PT31 and PT32 are connected to the node ND24 of the second circuit part 52a. In addition, an output signal of the second circuit part 52a of the same stage of shift register circuit 50a is an example of the "second signal" of the present invention. Furthermore, the transistor PT32 is provided in order to turn off the transistor PT33 by supplying a signal at H level to a gate of the transistor PT33 when the transistor PT31 is in on state.

Furthermore, a source of the transistor PT33 is connected to the node ND26 and a drain thereof is connected to the negative-side potential VVSS. The gate of the transistor PT33 is connected to the node ND25.

Here, according to the second embodiment, the capacitor C25 is connected between the gate and the source of the transistor PT33. In addition, a source of the transistor PT34 is connected to the node ND25 side and a drain thereof is connected to the clock signal line (VCLK2). The transistor PT34 is diode-connected.

Still further, according to the second embodiment, the transistor PT35 is connected between the transistor PT34 and the node ND25. An output signal of the second circuit part 52b of the next stage of shift register circuit 50b is supplied to a gate of the transistor PT35. In addition, the output signal of the second circuit part 52b of the next stage of shift register circuit 50b is an example of the "first signal" of the present invention.

In addition, the capacitor C26 is connected between the gate and the drain of the transistor PT33. The capacitor C26 is provided in order to prevent malfunction of the transistor PT33 caused by too much lowering of the potential of the node ND25 when the transistor PT35 is switched from off state to on state.

Furthermore, similar to the first circuit part 51a, the second circuit part 52a and the third circuit part 53a, the fourth circuit part 54a constituting the first stage of shift register circuit 50a comprises transistors PT36, PT37, PT38, PT39 and PT40, and capacitors C27 and C28 having a structure shorting out the source and the drain of the transistor. In addition, the transistor PT36 is an example of the "sixth transistor" of the present invention, the transistor PT37 is an example of the "seventh transistor" of the present invention. In addition, the transistor PT38 is an example of the "fifth transistor" of the present invention and the transistor PT39 is an example of the "second diode" and the "tenth transistor" of the present invention. Furthermore, the transistor PT40 is an example of the "eighth transistor" of the present invention and the capacitor C27 is an example of the "second capacitor" of the present invention. In addition, the fourth circuit part 54a of the first stage of shift register circuit 50a is different from the first circuit part 51a, the second circuit part 52a and the third circuit part 53a in that it further comprises the transistors PT41, PT42, PT43 and PT44, and a capacitor C29 having a structure shorting out the source and the drain of the transistor.

A source of the transistor PT36 is connected to the positive-side potential VVDD, and a drain thereof is connected to a node ND28. A source of the transistor PT37 is connected to the positive-side potential VVDD and a drain thereof is connected to a node ND27. Gates of the transistors PT36 and PT37 are connected to the node ND26 of the third circuit part 53a. In addition, the transistor PT37 is provided in order to turn off the transistor PT38 by supplying a signal at H level to a gate of the transistor PT38 when the transistor PT36 is in on state.

Furthermore, a source of the transistor PT38 is connected to the node ND28 and a drain thereof is connected to the negative-side potential VVSS. The gate of the transistor PT38 is connected to the node ND27.

Here, according to the second embodiment, the capacitor C27 is connected between the gate and the source of the transistor PT38. In addition, a source of the transistor PT39 is connected to the node ND27 side and a drain thereof is connected to the clock signal line (VCLK2). The transistor PT39 is diode-connected.

Still further, according to the second embodiment, the transistor PT40 is connected between the transistor PT39 and the node ND27. That is, a source of the transistor PT40 is connected to the node ND27 and a drain thereof is connected to the source of the transistor PT39. An output signal of the second circuit part 52a of the same stage of the shift register circuit 50a is supplied to a gate of the transistor PT40.

In addition, the capacitor C28 is connected between the gate and the drain of the transistor PT38. The capacitor C28 is provided in order to prevent malfunction of the transistor PT38 caused by too much lowering of the potential of the node ND27 when the transistor PT40 is switched from off state to on state.

Furthermore, a source of the transistor PT41 is connected to the positive-side potential VVDD and a drain thereof is connected to the node ND28. The enable signal ENB is supplied to a gate of the transistor PT41. A transfer gate TG1 is constituted by the transistor PT41 and the transistor PT36.

In addition, a source of the transistor PT42 is connected to the drain of the transistor PT38 and a drain thereof is connected to the negative-side potential VVSS. A gate of the transistor PT42 is connected to the node ND29. Thus, an inversion enable signal XENB is supplied to the gate of the transistor PT42. In addition, the capacitor C29 is connected between the gate and the source of the transistor PT42.

Furthermore, a source of the transistor PT43 is connected to the positive-side potential VVDD and a drain thereof is connected to the node 29. The enable signal ENB is supplied to a gate of the transistor PT43.

Still further, a source of the transistor PT44 is connected to an inversion enable signal line (XEXB) and a drain thereof is connected to the node ND29. Then, the transistor PT44 is diode-connected.

Second and later stages of shift register circuits 50b, 50c, 50d, . . . and 50$_n$ have the same circuit constitutions as that of the above first stage of shift register circuit 50a. That is, the second or later stages of 50b, 50c, 50d, . . . and 50$_n$ each comprise first circuit parts 51b, 51c, 51d, . . . and 51$_n$, second circuit parts 52b, 52c, 52d, . . . and 52$_n$, third circuit parts 53b, 53c, 53d, . . . and 53$_n$ and fourth circuit parts 54b, 54c, 54d, . . . and 54$_n$ which have the same circuit constitutions as the first circuit part 51a and the second circuit part, 52a, the third circuit part 53a and the fourth circuit part 54a of the first stage of shift register circuit 50a.

Here, according to the second embodiment, an output signal (the first signal) of the fourth circuit part of the same stage of shift register circuit is supplied to the gate of the predetermined stage of transistor PT25, and the output signal of the fourth circuit part of the former stage of shift register circuit or the start signal VST (the second signal) is supplied to the gate of transistor PT30. In addition, the output signal (the first signal) of the second circuit part of the next stage of shift register circuit is supplied to the gate of the predetermined stage (except for the last stage) of transistor PT35, and the output signal (the second signal) of the second circuit part of the same stage of shift register circuit is supplied to the gate of transistor PT40.

Figure 6:
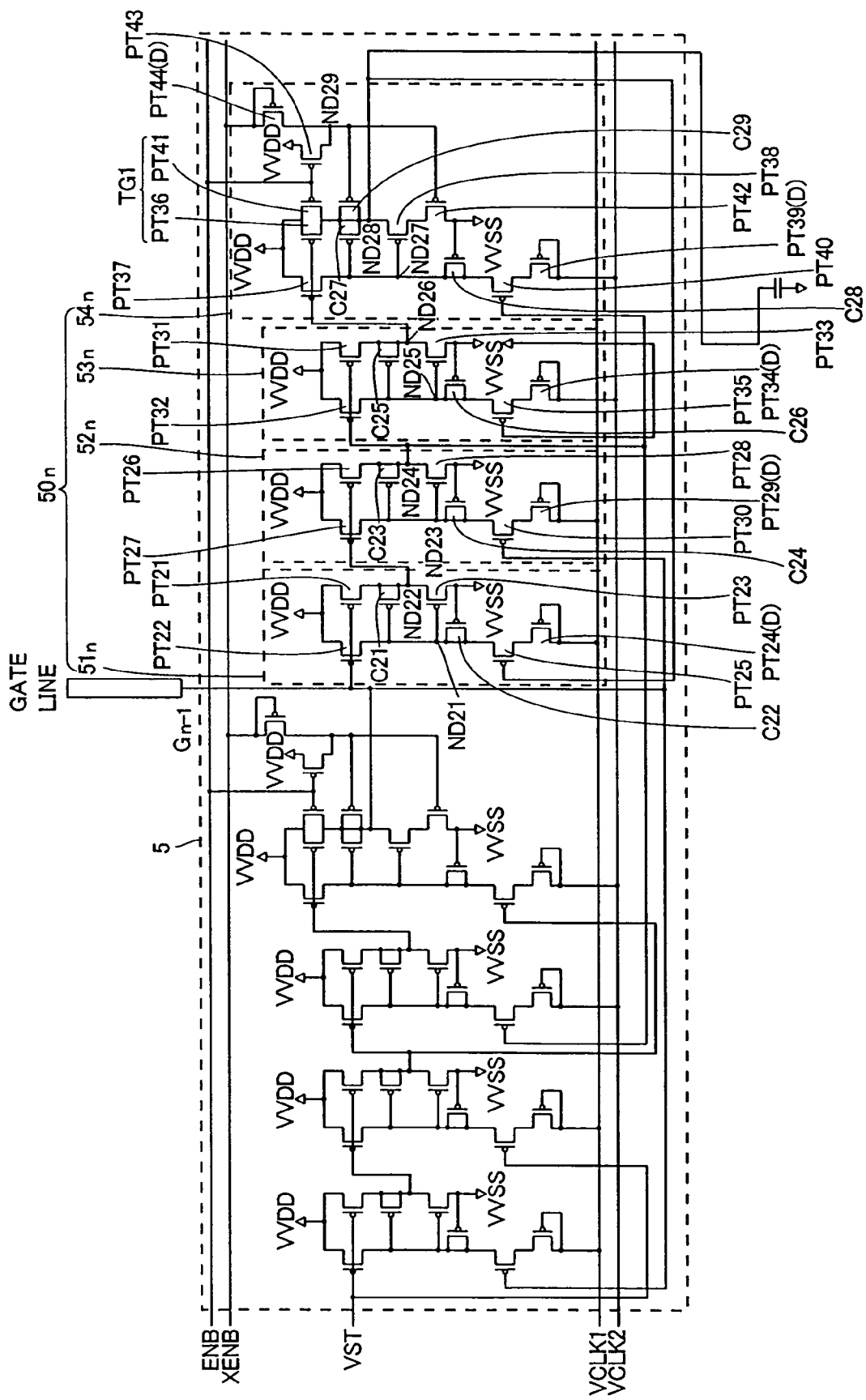
FIG. 6 is a circuit diagram of the last stage of shift register circuit shown in FIG. 5.

In addition, as shown in FIG. 6, the gate of the transistor PT35 of the third circuit part 53$_n$ of the last stage of shift register circuit 50$_n$ is connected to the negative-side potential VVSS. Therefore, the signal at L level is constantly supplied to the gate of the transistor PT35 of the last stage of shift register circuit 50$_n$.

Next, an operation of the V driver 5 of the liquid crystal display according to the second embodiment is described with reference to FIGS. 5 to 7.

First, in an initial state, in the first stage of shift register circuit 50a, the output signal of the first circuit part 51a and the output signal of the third circuit part 53a are at L level and the output signal of the second circuit part 52a and the output signal G1 of the fourth circuit part 54a are at H level. In addition, in the second stage of shift register circuit 50b, the output signal of the first circuit part 51b and the output signal of the third circuit part 53b are at L level and the output signal of the second circuit part 52b and the output signal G2 of the fourth circuit part 54b are at H level.

In this state, after the start signal VST at L level is input, when the clock signal VCLK1 becomes L level and the clock signal VCLK2 becomes H level, the signal at L level is output from the second circuit part 52a by the same operation as that of the H driver 3 of the above-described first embodiment. Thus, the transistors PT31 and PT32 in the third circuit part 53a are turned on. At this time, since the transistor PT33 is turned off, the output signal at H level is output from the third circuit part 53a.

At this time, according to the second embodiment, since the output signal at H level of the second circuit part 52b of the second stage of shift register circuit 50b is supplied to the gate of the transistor PT35, the transistor PT35 is turned off. Therefore, even when the transistor PT32 and the transistor PT34 of the first stage of shift register circuit 50a are in on state, the through-current does not flow from the VVDD to the clock signal line (VCLK2) through the transistors PT32 and PT34.

Then, the signal at H level of the third circuit part 53a is input to the gate of the transistor PT37 and to one gate of the transfer gate TG1. At this time, since the enable signal ENB is held at H level, the transfer gate TG1 is turned off. In addition, since the node ND27 becomes a floating state while held at H level, the transistor PT38 is also held in off state. Thus, the output signal G1 at H level is kept output from the first stage of shift register circuit 50a. Even when the start signal VST becomes H level, the signal at L level is kept output from the second circuit part 52a by the same operation as that of the H driver 3 of the above-described first embodiment. Thus, the output signal G1 at H level is kept output from the first stage of shift register circuit 50a to the gate line.

Then, the ENB signal becomes L level and the XENB signal becomes H level. Thus, the transfer gate TG1 to which the ENB signal at L level is input is turned on. In addition, since the ENB signal at L level is also input to the gate of the transistor PT43, the transistor PT43 is turned on. Thus, since the potential of the node ND29 becomes H level, the transistor PT42 whose gate is connected to the node ND29 is turned off. Thus, since the potential of the node ND28 becomes H level, the output signal G1 at H level is kept output from the first stage of shift register circuit 50a to the gate line.

Then, while the ENB signal is at L level, the clock signal at L level is input from the clock signal line VCLK2 through the transistor PT34 of the third circuit part 53a. At this time, since the transistors PT31 and PT32 of the third circuit part 53a are in on state, the potential of the node ND25 of the third circuit part 53a is held at H level. Thus, since the transistor PT33 of the third circuit part 53a is turned off, the signal at H level is output from the third circuit part 53a. The output signal at H level is input to the gate of the transistor PT37 of the fourth circuit part 54a and to one gate of the transfer gate TG1. Thus, the transistor PT37 is held in off state. Meanwhile, since the ENB signal at L level is input to the other gate of the transfer gate TG1, the transfer gate TG1 is held in on state.

In the meantime, the clock signal at L level is input to the fourth circuit part 53a from the clock signal line VCLK2 through the transistor PT39. Thus, since the potential of the node ND27 becomes L level, the transistor PT38 is turned on. However, in this case, since the ENB signal is at L level, the transistor PT43 is held in on state. Therefore, since the transistor PT42 is held in off state, the node ND 28 is held at H level. Thus, in this state, the output signal G1 at H level is held from the first stage of shift register circuit 50a to the gate line.

Then, when the enable signal ENB becomes H level and the inversion enable signal XENB becomes L level, the transfer gate TG1 and the transistor PT43 are turned off. In addition, since the inversion enable signal XENB at L level is supplied to the gate of the transistor PT44, the transistor PT44 is turned on. Then, the potential of the node ND29 of the first stage of shift register circuit 50a is lowered to L level by the on-state transistor PT44 of the first stage of shift register circuit 50a. Thus, since the transistor PT42 is turned on, the potential of the node ND28 is lowered to VVSS and becomes L level by a function of the capacitor C27. Therefore, the output signal G1 from the first stage of shift register circuit 50a becomes L level.

Then, when the ENB signal becomes L level and the XENB signal becomes H level, the transfer gate TG1 and transistor PT43 are turned on. Thus, since the potential of the node ND29 becomes H level, the transistor PT42 whose gate is connected to the ND29 is turned off. Therefore, since the transfer gate TG1 is turned on and the transistor PT42 is turned off, the potential of the node ND28 becomes H level.

Thus, the output signal G1 at H level is output from the first stage of shift register circuit 50a to the gate line.

In addition, the output signal G1 at H level from the first stage of shift register circuit 50a is also input to the first circuit part 51b of the second stage of shift register circuit 50b. The second and later stages of shift register circuits perform the same operation as in the above-described first stage of shift register circuit 50a by the output signal from the former stage of shift register circuit, the clock signals VCLK1 and VCLK2, the ENB signal and the XENB signals. Thus, respective stages of gate lines are sequentially driven (scanned). In this case, since the output from the shift register circuit is forced to be held at H level while the ENB signal is at L level, the output signal at L level of the former stage of shift register circuit and the output signal at L level of the latter stage of shift register circuit are prevented from overlapping with each other, by lowering the ENB signal to L level at timing shown in FIG. 7.

In addition, as shown in FIG. 6, the signal at L level is constantly supplied to the gate of the transistor PT35 of the last stage of shift register circuit $50_n$. Therefore, the transistor PT35 of the last stage of shift register circuit $50_n$ is constantly in on state.

According to the second embodiment, as described above, since the transistor PT25 which is turned on in response to the output signal $G_m$ of the same stage of shift register circuit $50_m$ and the transistor PT30 which is turned on in response to the output signal $G_{m-1}$ of the former stage of shift register circuit $50_{m-1}$ or the start signal VST are provided, a period at L level of the output signal $G_m$ of the same stage of shift register circuit $50_m$ and a period at L level of the output signal $G_{m-1}$ of the former stage of shift register circuit $50_{m-1}$ (on states of the transistors PT25 and PT30) do not overlap with each other. As a result, the transistor PT25 and the transistor PT30 are not turned on at the same time. Since the transistor PT22 is turned on in response to the output signal $G_{m-1}$ of the former stage of shift register circuit $50_{m-1}$ or the start signal VST, the transistor PT25 and the transistor PT22 are not turned on at the same time. Therefore, the through-current can be prevented from flowing between VVDD and the clock signal line (VCLK1) through the transistor PT25 and the transistor PT22.

In addition, since there are provided the transistor PT35 which is turned on in response to the output signal of the second circuit part $52_{m+1}$ of the next stage of shift register circuit $50_{m+1}$ to supply the clock signal VCLK2 to the transistor PT33, and the transistor PT40 which is turned on in response to the output signal of the second circuit part $52_m$ of the same stage of shift register circuit $50_m$ to supply the clock signal VCLK2 to the transistor PT38, a period at L level of the output signal of the second circuit part $52_{m+1}$ of the next stage of shift register circuit $50_{m+1}$ and a period at L level of the output signal of the second circuit part $52_m$ of the same stage of shift register circuit $50_m$ (on states of the transistors PT35 and PT40) do not overlap with each other. As a result, the transistor PT35 and the transistor PT40 are not turned on at the same time. Therefore, the through-current can be prevented from flowing between VVDD and the clock signal line (VCLK2) through the transistor PT35 and the transistor PT32.

Still further, since the transistor PT27 is in off state while the transistor PT30 which is turned on in response to the output signal $G_{m-1}$ of the former stage of shift register circuit $50_{m-1}$ or the start signal VST is in on state, and the transistor PT37 is in off state while the transistor PT40 which is turned on in response to the output signal of the second circuit part $52_m$ of the same stage of shift register circuit $50_m$ is in on state, the transistor PT30 (PT40) and the transistor PT27 (PT37) are not turned on at the same time. Therefore, the through-current is prevented from flowing between VVDD and the clock signal line (VCLK1) through the transistor PT30 and the transistor PT27 and the through-current can be prevented from flowing between VVDD and the clock signal line (VCLK2) through the transistor PT40 and the transistor PT37, In addition, when the transistor PT22 (PT32) is in on state, the transistor PT21 (PT31) is turned on and the transistor PT23 (PT33) is turned off, so that the transistor PT21 (PT31) and the transistor PT23 (PT33) are not turned on at the same time. Therefore, the through-current can be prevented from flowing between VVDD and VVSS through the transistors PT21 and PT23 and the through-current is prevented from flowing between VVDD and VVSS through the transistors PT31 and PT33. In addition, when the transistor PT27 (PT37) is in on state, the PT26 (PT36) is turned on and the transistor PT28 (PT38)) is turned off, the through-current can be prevented from flowing between VVDD and VVSS through the transistors PT26 and PT28 and the through-current can be prevented from flowing between VVDD and VVSS through the transistors PT36 and PT38. As a result, the current consumption of the V driver 5 of the liquid crystal display can be prevented from being increased.

In addition, other effects of the second embodiment are the same as in the first embodiment.

Third Embodiment

Figure 8:
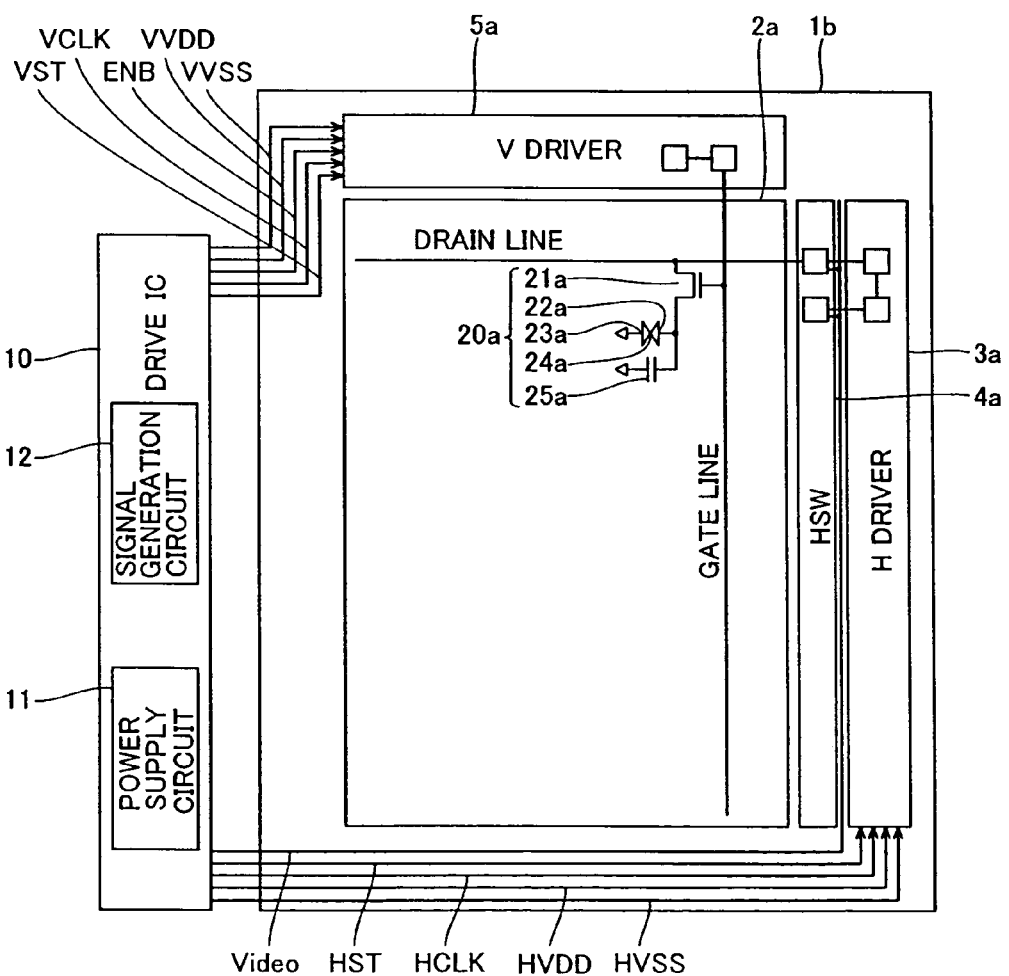
FIG. 8 is a plan view showing a liquid crystal display according to a third embodiment of the present invention.
Figure 9:
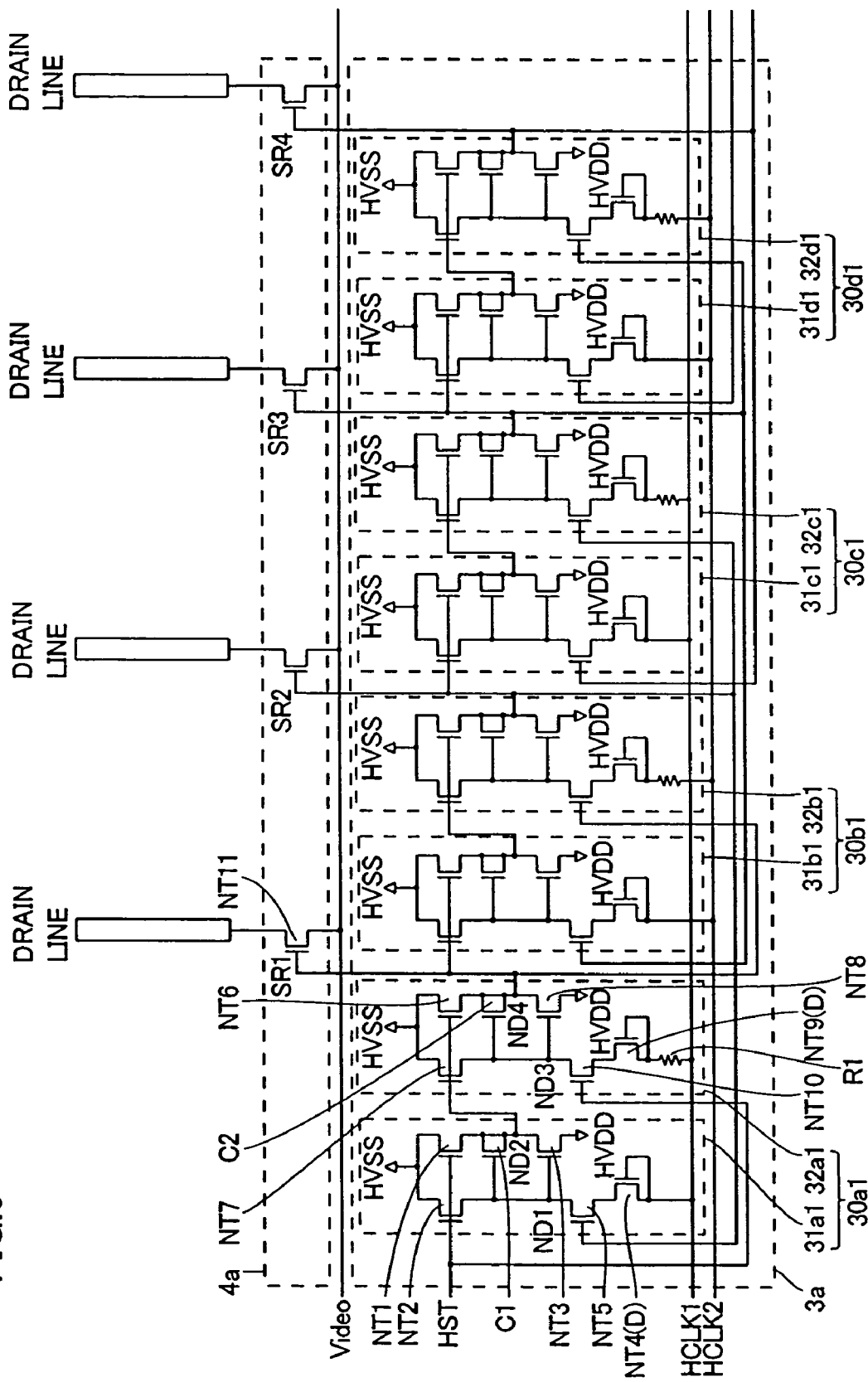
FIG. 9 is a circuit diagram showing a shift register circuit constituting an H driver of the liquid crystal display according to the third embodiment shown in FIG. 8.
Figure 10:
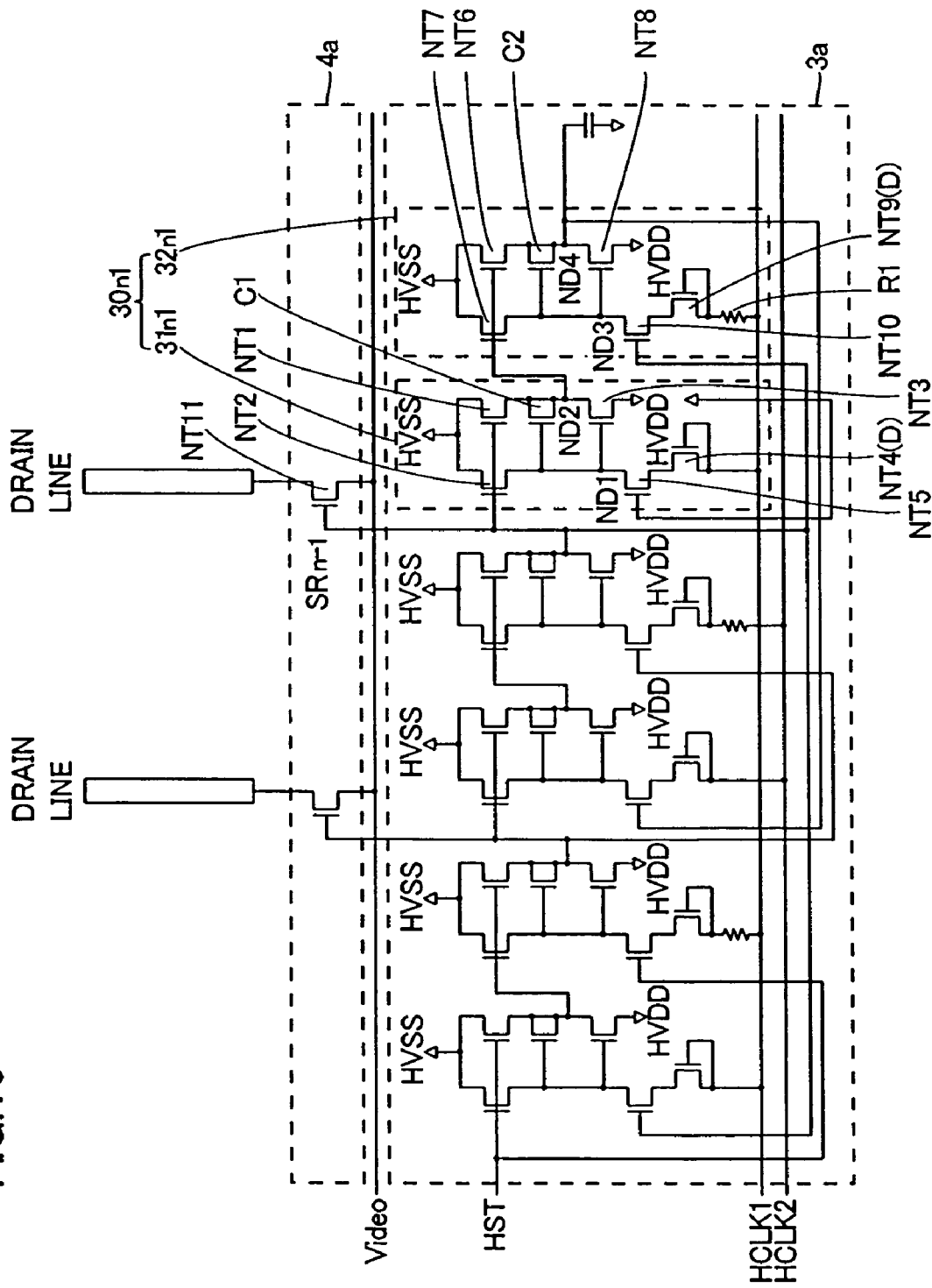
FIG. 10 is a circuit diagram of the last stage of shift register circuit shown in FIG. 9.

According to a third embodiment, a description is given of a case where the transistor constituting the shift register circuit and the horizontal switch of the H driver is an n-channel transistor with reference to FIGS. 8 to 10.

According to the third embodiment, as shown in FIG. 8, a display part 2a, an H driver 3a, a horizontal switch 4a, and a V driver 5a are formed on a substrate 1b. A constitution for one pixel is shown in the display part 2a in FIG. 8. Although only two of the horizontal switches 4a are shown in FIG. 8, they are arranged by the number corresponding to the number of pixels. In addition, referring to the H driver 3a and the V driver 5a, although only two shift registers constituting them are shown in FIG. 8, they are arranged by the number corresponding to the number of pixels. In addition, pixels 20a are arranged in the shape of a matrix in the display part 2a. Each of pixels 20a comprises an n-channel transistor 21a, a pixel electrode 22a, an opposite electrode 23a, a liquid crystal 24a and a subsidiary capacitance 25a. A source of the n-channel transistor 21a is connected to the pixel electrode 22a and to one electrode of the subsidiary capacitance 25a. A drain of the n-channel transistor 21a is connected to a drain line and a gate of the n-channel transistor 21a is connected to a gate line.

In addition, similar to the first embodiment, a drive IC 10 comprising a power supply circuit 11 and a signal generation circuit 12 is provided outside of the substrate 1b. A circuit for generating positive-side potentials HVDD and VVDD, and negative-side potentials HVSS and VVSS is provided in the power supply circuit 11. Furthermore, a circuit for generating start signals HST and VST, clock signals HCLK and VCLK and an enable signal ENB is provided in the signal generation circuit 12. In addition, a video signal Video is output from the drive IC 10.

Next, a description is given of circuit constitutions of the H driver 3a and the horizontal switch 4a of a liquid crystal display according to the third embodiment. The H driver 3a of the liquid crystal display according to the third embodiment consists of plural stages of shift register circuits 30a1, 30$b$1, 30$c$1, 30$d$1, ... and 30$_n$1 comprising first circuit parts (31$a$1, 31$b$1, 31$c$1, 31$d$1, ... and 31$_n$1) and second circuit parts (32$a$1, 32$b$1, 32$c$1, 32$d$1, ... and 32$_n$1) as shown in FIG. 9. In addition, the shift register circuits 30$a$1, 30$b$1, 30$c$1, 30$d$1, ... and 30$_n$1 are provided in the H driver 3$a$ by the number of stages corresponding to the number of the pixels.

Here, according to the third embodiment, the shift register circuits 30$a$1, 30$b$1, 30$c$1, 30$d$1, ... and 30$_n$1 are constituted by TFTs comprising a plurality of n-type MOS transistors. Hereinafter, the TFT comprising the n-type MOS transistor is simply referred to as the transistor in the third embodiment.

The first circuit part 31$a$1 constituting the first stage of shift register circuit 30$a$1 comprises transistors NT1, NT2, NT3, NT4 and NT5, and a capacitor C1 having a structure shorting out the source and the drain of the transistor. The transistors NT1, NT2, NT3, NT4 and NT5 are connected to positions corresponding to the transistors PT1, PT2, PT3, PT4 and PT5 in the first embodiment, respectively. However, unlike the first embodiment, sources of the transistors NT1 and NT2 are connected to the negative-side potential HVSS, and a drain of the transistor NT3 is connected to the positive-side potential HVDD.

In addition, the second circuit part 32$a$1 constituting the first stage of shift register circuit 30$a$1 comprises transistors NT6, NT7, NT8, NT9 and NT10, a capacitor C2 having a structure shorting out the source and the drain of the transistor and a resistance R1. The transistors NT6, NT7, NT8, NT9 and NT10 are connected to positions corresponding to the transistors PT6, PT7, PT8, PT9 and PT10 in the first embodiment shown in FIG. 2, respectively. However, unlike the first embodiment, sources of the transistors NT6 and NT7 are connected to the negative-side potential HVSS, and a drain of the transistor NT8 is connected to the positive-side potential HVDD.

In addition, as shown in FIG. 10, a gate of the transistor NT5 of the last stage of shift register circuit 30$_n$1 is connected to the positive-side potential HVDD. Therefore, the signal at H level is constantly supplied to the gate of the transistor NT5 of the last stage of shift register circuit 30$_n$1.

In addition, as shown in FIG. 9, a transistor NT11 is provided at each stage in the horizontal switch 4$a$. A source of the transistor NT11 is connected to a drain line. A drain thereof is connected to a video signal line Video. A gate of the transistor NT11 at each stage is connected to a node ND4 at each stage. Thus, each of output signals (SR1, SR2, SR3, SR4 ... and SR$_{n-1}$) are supplied to the transistor NT11 at each stage. In addition, the output signals of the respective stages (SR1, SR2, SR3, SR4 ... and SR$_{n-1}$) are input to the sources of the horizontal switches 4$a$ provided by the number corresponding to the number of pixels (when three kinds of video signals Video such as red (R), green (G) and blue (B) are input, the number of the video signal lines is three).

Figure 11:
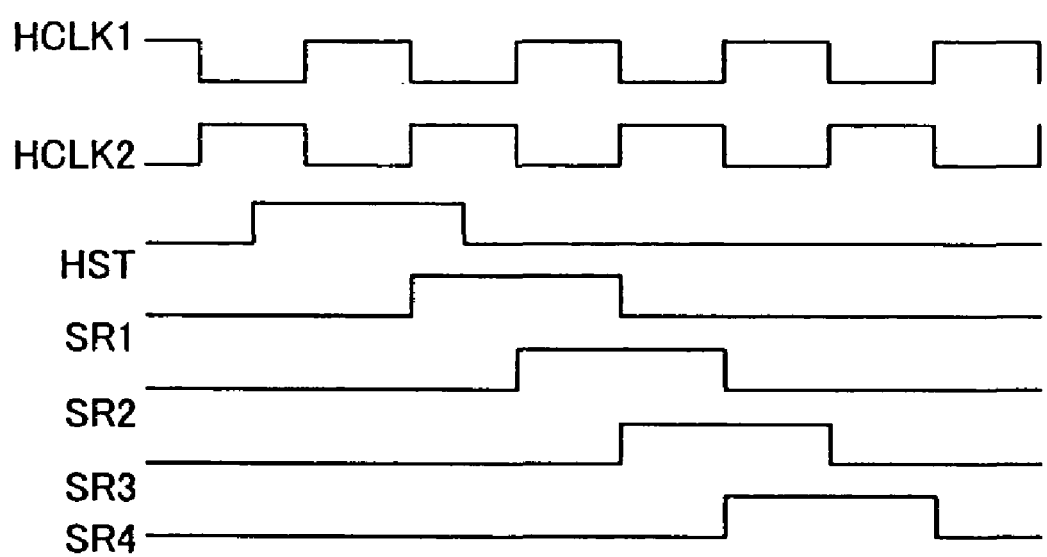
FIG. 11 is a waveform chart for explaining operations of the H driver and a horizontal switch shown in FIGS. 9 and 10.

Referring to FIG. 11, in the shift register circuit of the H driver according to the third embodiment, signals having waveforms provided by inverting H level and L level of the clock signals HCLK1 and HCLK2 and the start signal HST are input as clock signals HCLK1 and HCLK2 and the start signal HST, respectively. Thus, signals having waveforms provided by inverting the H level and L level of the output signals SR1 to SR4 from the shift register circuit according to the first embodiment shown in FIG. 4 are output from the shift register circuit of the H driver according to the third embodiment. An operation of the shift register circuit according to the third embodiment other than the above is the same as that of the shift register circuit according to the first embodiment.

According to the third embodiment, as described above, the same effect as in the first embodiment such that the current consumption of the H driver can be prevented from being increased can be provided.

Fourth Embodiment

Figure 12:
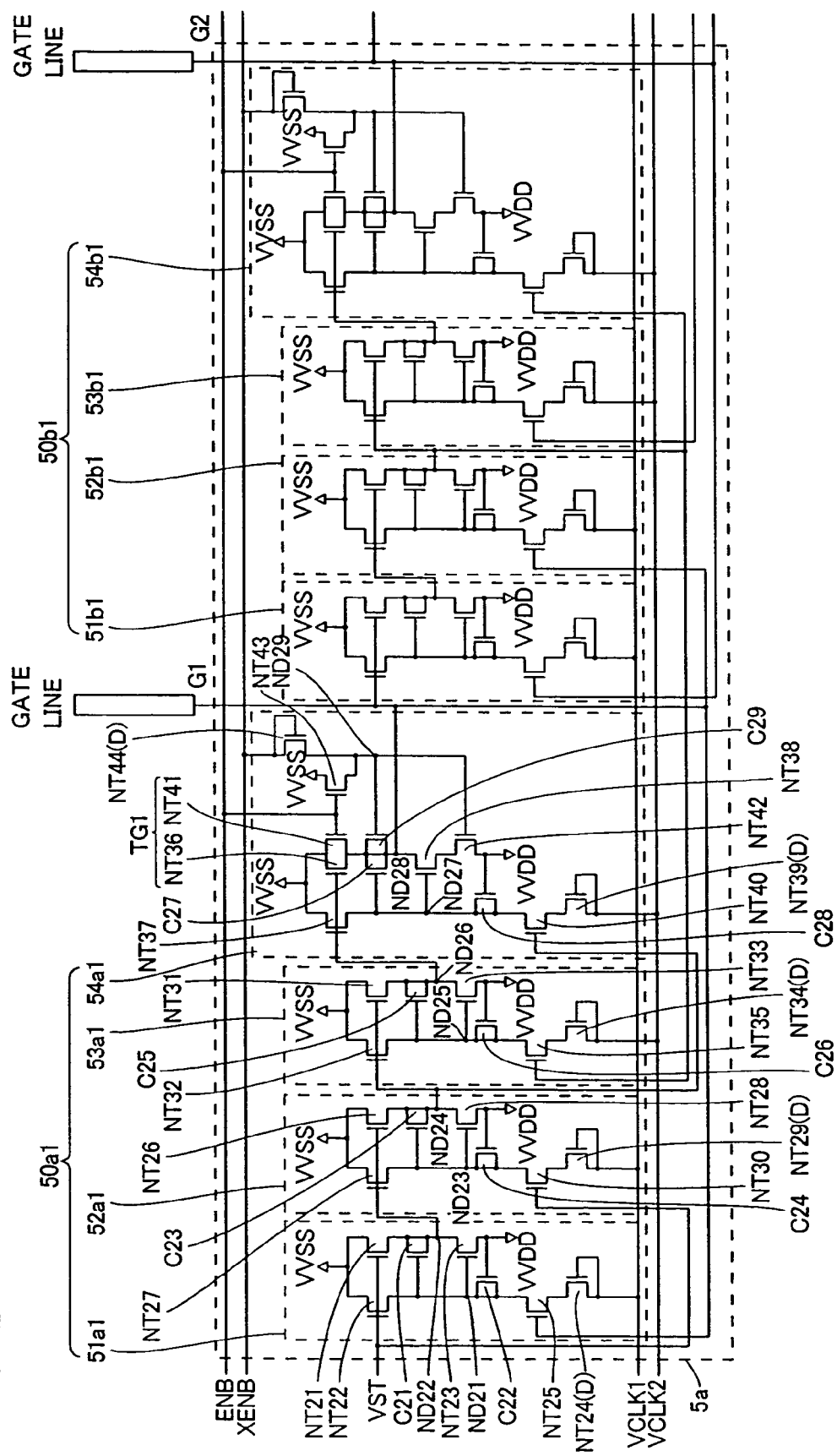
FIG. 12 is a circuit diagram showing a shift register circuit constituting a V driver of a liquid crystal display according to a fourth embodiment of the present invention.
Figure 13:
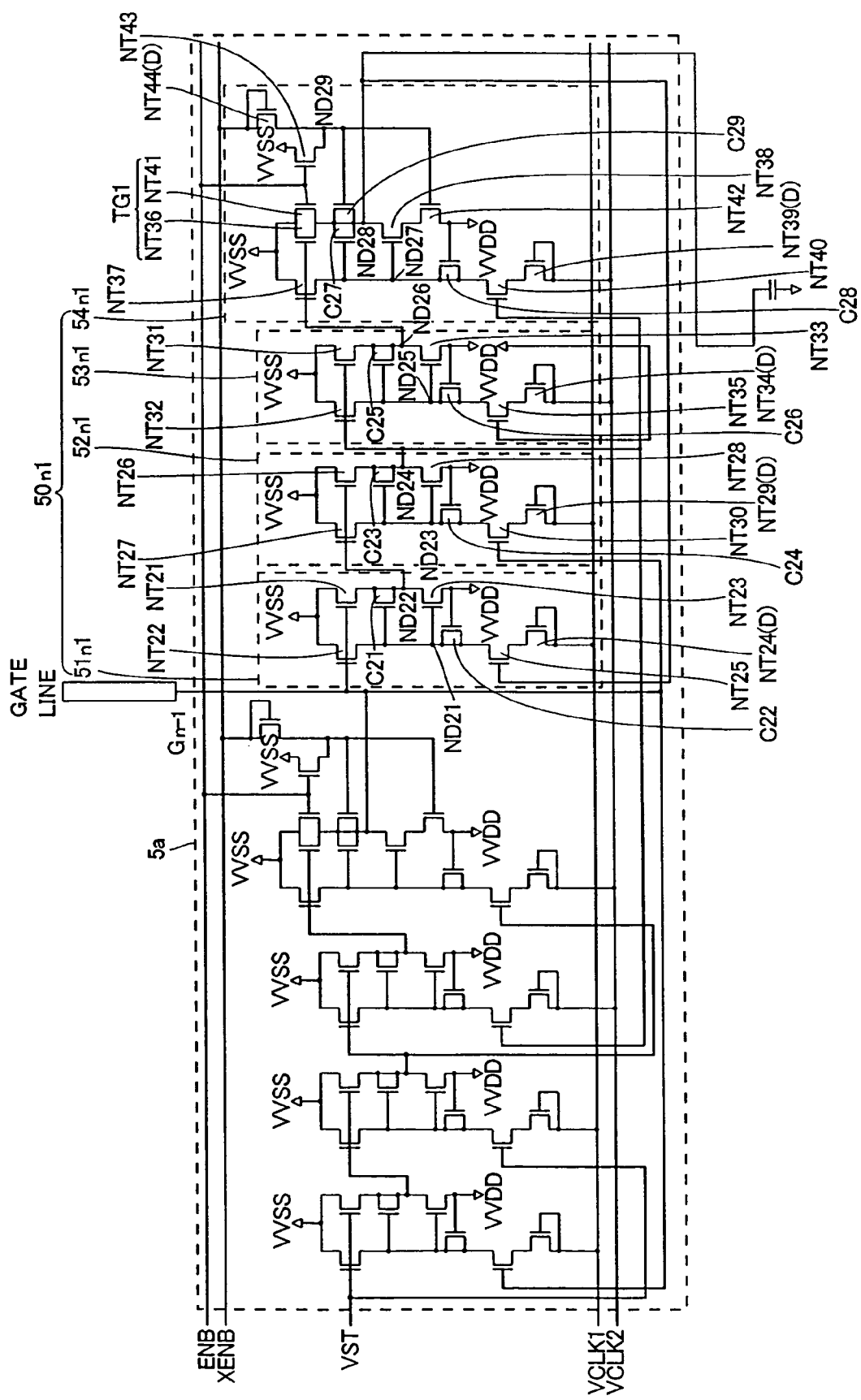
FIG. 13 is a circuit diagram of the last stage of shift register circuit shown in FIG. 12.

According to a fourth embodiment, a description is given of a case where a transistor constituting the shift register circuit of the V driver is an n-channel transistor with reference to FIGS. 12 and 13.

More specifically, the V driver 5$a$ of the liquid crystal display according to the fourth embodiment consists of plural stages of shift register circuits 50$a$1, 50$b$1, 50$c$1, 50$d$1, ... and 50$_n$1 comprising first circuit parts (51$a$1, 51$b$1, 51$c$1, 51$d$1, ... and 51$_n$1), second circuit parts (52$a$1, 52$b$1, 52$c$1, 52$d$1, ... and 52$_n$1), third circuit parts (53$a$1, 53$b$1, 53$c$1, 53$d$1, ... and 53$_n$1), and fourth circuit parts (54$a$1, 54$b$1, 54$c$1, 54$d$1, ... and 54$_n$1) as shown in FIG. 12, respectively.

Here, according to the fourth embodiment, the shift register circuits 50$a$1, 50$b$1, 50$c$1, 50$d$1, ... and 50$_n$1 are constituted by TFTs comprising a plurality of n-type MOS transistors. Hereinafter, the TFT comprising the n-type MOS transistor is simply referred to as the transistor in the fourth embodiment.

The first circuit part 51$a$1 constituting the first stage of shift register circuit 50$a$1 comprises transistors NT21, NT22, NT23, NT24 and NT25, and capacitors C21 and C22 having a structure shorting out the source and the drain of the transistor. The transistors NT21, NT22, NT23, NT24 and NT25 are connected to positions corresponding to the transistors PT21, PT22, PT23, PT24 and PT25 in the second embodiment shown in FIG. 5, respectively. However, unlike the second embodiment, sources of the transistors NT21 and NT22 are connected to the negative-side potential VVSS, and a drain of the transistor NT23 is connected to the positive-side potential VVDD.

In addition, the second circuit part 52$a$1 constituting the first stage of shift register circuit 50$a$1 comprises transistors NT26, NT27, NT28, NT29 and NT30, and capacitors C23 and C24 having a structure shorting out the source and the drain of the transistor. The transistors NT26, NT27, NT28, NT29 and NT30 are connected to positions corresponding to the transistors PT26, PT27, PT28, PT29 and PT30 in the second embodiment shown in FIG. 5, respectively. However, unlike the second embodiment, sources of the transistors NT26 and NT27 are connected to the negative-side potential VVSS, and a drain of the transistor NT28 is connected to the positive-side potential VVDD.

In addition, the third circuit part 53$a$1 constituting the first stage of shift register circuit 50$a$1 comprises transistors NT31, NT32, NT33, NT33 and NT35, and capacitors C25 and C26 having a structure shorting out the source and the drain of the transistor. The transistors NT31, NT32, NT33, NT34 and NT35 are connected to positions corresponding to the transistors PT31, PT32, PT33, PT34 and PT35 in the second embodiment shown in FIG. 5, respectively. However, unlike the second embodiment, sources of the transistors NT31 and NT32 are connected to the negative-side potential VVSS, and a drain of the transistor NT33 is connected to the positive-side potential VVDD.

In addition, the fourth circuit part 54$a$1 constituting the first stage of shift register circuit 50$a$1 comprises transistors NT36, NT37, NT38, NT39 and NT40, and capacitors C27 and C28 having a structure shorting out the source and the drain of the transistor. The transistors NT36, NT37, NT38, NT39 and NT40 are connected to positions corresponding to the transistors PT36, PT37, PT38, PT39 and PT40 in the second embodiment shown in FIG. 5, respectively. However, unlike the second embodiment, sources of the transistors NT36 and NT37 are connected to the negative-side potential VVSS, and a drain of the transistor NT38 is connected to the positive-side potential VVDD. In addition, the fourth circuit part 54a further comprises transistors NT41, NT42, NT43 and NT44, and a capacitor C29 having a structure shorting out the source and the drain of the transistor. The transistors NT41, NT42, NT43 and NT44 are connected to positions corresponding to the transistors PT41, PT42, PT43 and PT44 in the second embodiment shown in FIG. 5, respectively. However, unlike the second embodiment, sources of the transistors NT41 and NT43 are connected to the negative-side potential VVSS, and a drain of the transistor NT42 is connected to the positive-side potential VVDD.

In addition, as shown in FIG. 13, a gate of the transistor NT35 of the last stage of shift register circuit $50_n1$ is connected to the positive-side potential VVDD. Therefore, the signal at H level is constantly supplied to the gate of the transistor NT35 of the last stage of shift register circuit 501.

Figure 7:
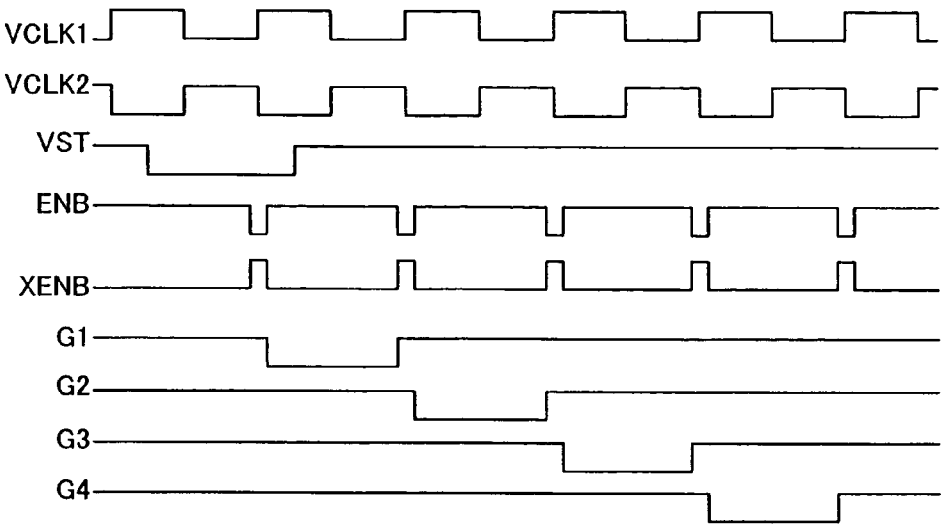
FIG. 7 is a waveform chart for explaining an operation of the V driver shown in FIGS. 5 and 6.
Figure 14:
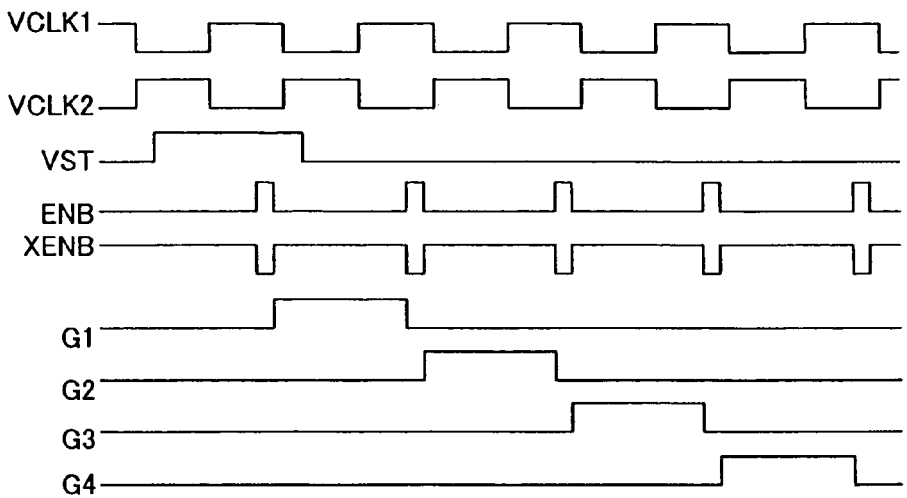
FIG. 14 is a waveform chart for explaining an operation of the V driver shown in FIGS. 12 and 13.

Referring to FIG. 14, in the shift register circuit of the V driver according to the fourth embodiment, signals having waveforms provided by inverting H level and L level of the clock signals VCLK1 and VCLK2 and the start signal VST in the second embodiment shown in FIG. 7 are input as clock signals VCLK1 and VCLK2 and the start signal VST, respectively. Thus, signals having waveforms provided by inverting the H level and L level of the output signals G1 to G4 from the shift register circuit according to the second embodiment shown in FIG. 7 are output from the shift register circuit of the V driver according to the fourth embodiment. An operation of the shift register circuit according to the fourth embodiment other than the above is the same as that of the shift register circuit according to the second embodiment.

According to the fourth embodiment, as described above, there can be provided the same effect as in the second embodiment such that the current consumption of the V driver can be prevented from being increased.

Fifth Embodiment

Figure 15:
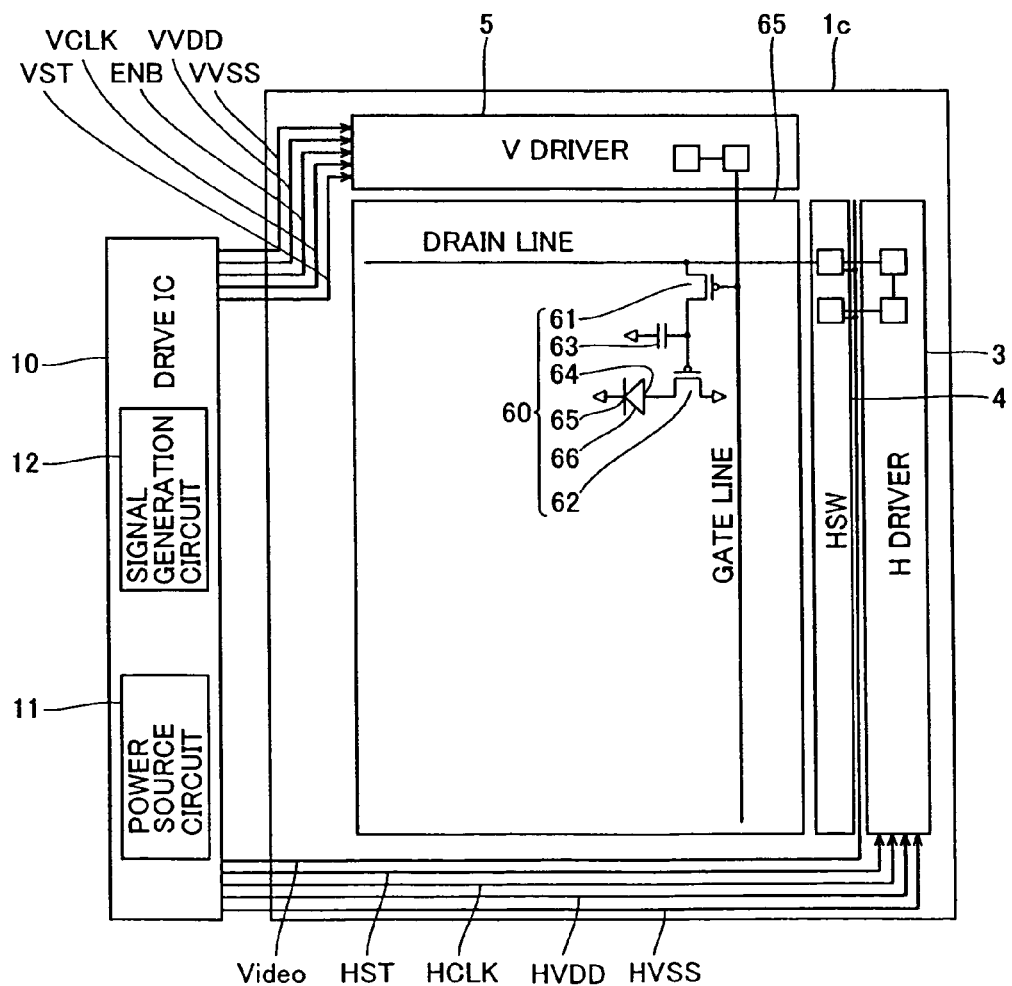
FIG. 15 is a plan view showing an organic EL display according to a fifth embodiment of the present invention.

According to a fifth embodiment, a description is given of a case where the present invention is applied to an organic EL display with reference to FIG. 15.

As shown in FIG. 15, according to the fifth embodiment, a display part 65 is provided on a substrate 1c. Each of pixels 60 arranged in the shape of a matrix in the display part 65 comprises p-channel transistors 61 and 62 (referred to as transistors 61 and 62 hereinafter), a subsidiary capacitance 63, an anode 64 and a cathode 65, and an organic EL element 66 sandwiched between the anode 64 and the cathode 65. A constitution for one pixel is shown in the display part 65 in FIG. 15. A source of the transistor 61 is connected to a drain line. A drain thereof is connected to a gate of a transistor 62 and to one electrode of the subsidiary capacitance 63. A gate of the transistor 61 is connected to a gate line. A source of the transistor 62 is connected to a current supplying line (not shown) and a drain thereof is connected to the anode 64.

In addition, the circuit constitution in the H driver 3 is the same as that of the H driver 3 according to the first embodiment in the shift register circuit using the p-channel transistor shown in FIGS. 2 and 3. In addition, the circuit constitution in the V driver 5 is the same as that of the V driver 5 according to the second embodiment in the shift register circuit using the p-channel transistor shown in FIGS. 5 and 6. Constitution other than the above in the organic EL display according to the fifth embodiment is the same as the liquid crystal display according to the first embodiment shown FIG. 1.

According to the fifth embodiment, in the above constitution, there can be provided the same effects as in the first and second embodiments such that an increase in current consumption of the H driver and the V driver is prevented in the organic EL display.

Sixth Embodiment

Figure 16:
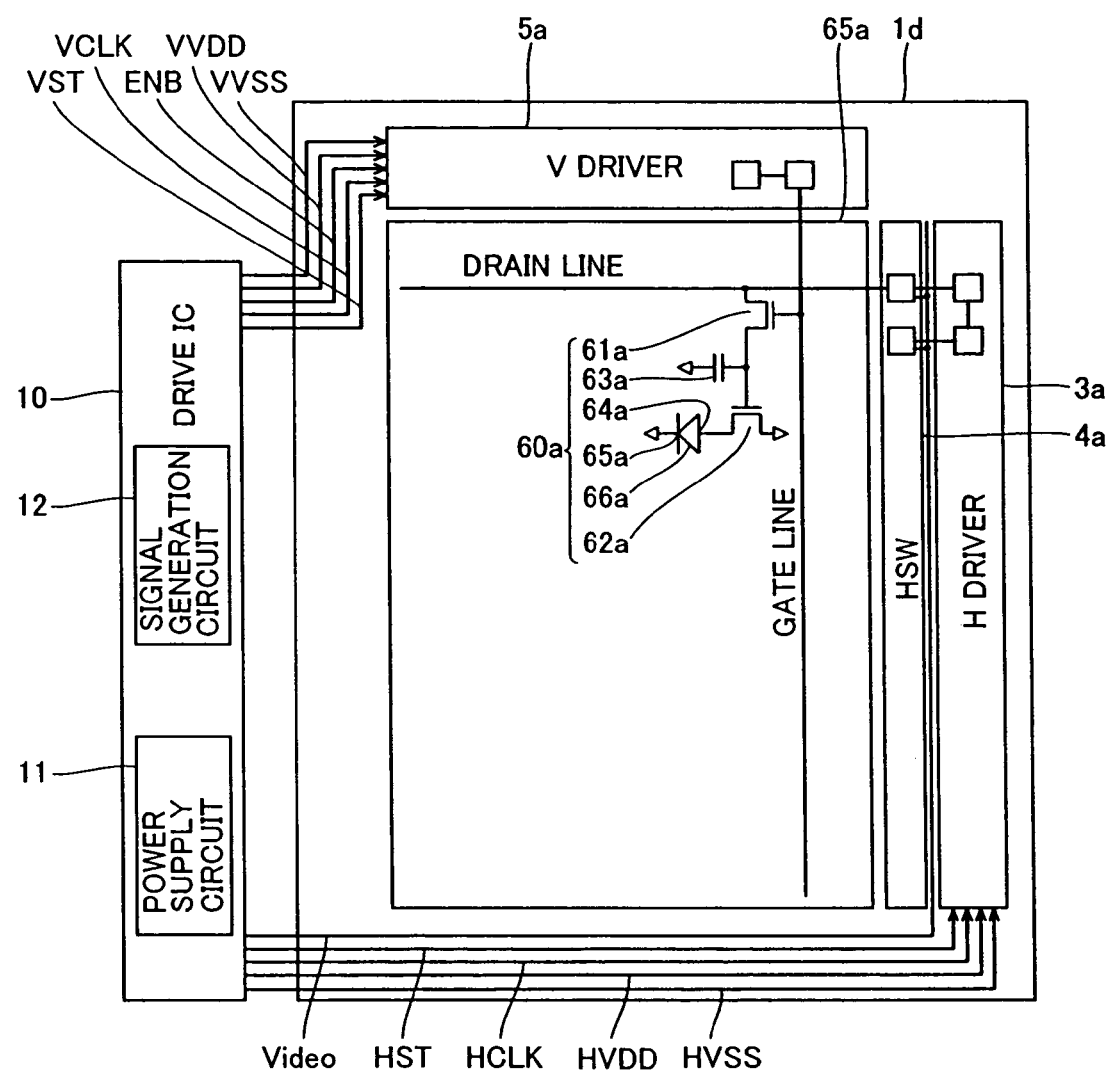
FIG. 16 is a plan view showing an organic EL display according to a sixth embodiment of the present invention.
Figure 17:
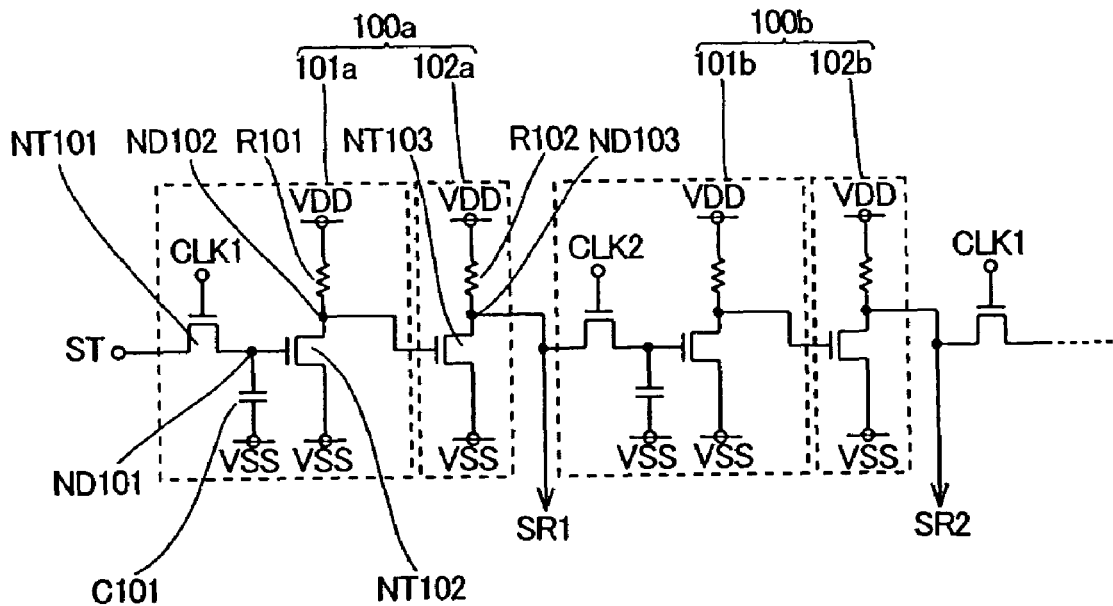
FIG. 17 is a circuit diagram showing a shift register circuit comprising the conventional resistance loading type of inverter circuit.
Figure 18:
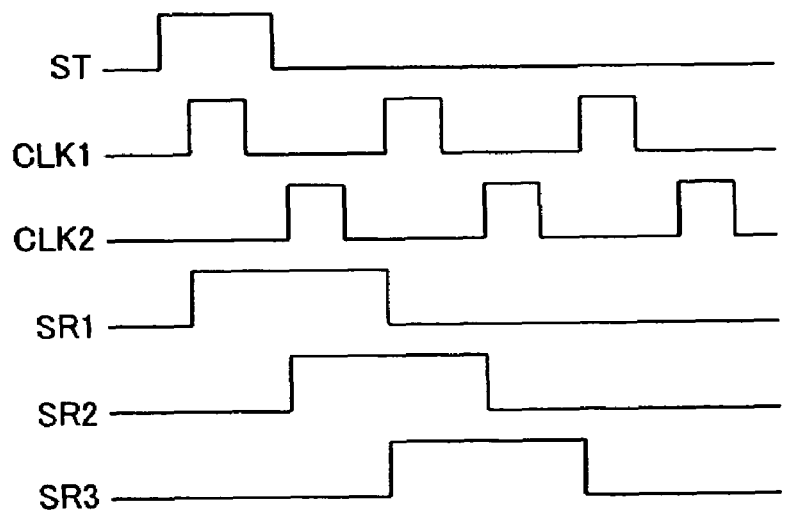
FIG. 18 is a waveform chart for explaining an operation of the conventional shift register circuit shown in FIG. 17.

According to a sixth embodiment, a description is given of a case where the present invention is applied to an organic EL display with reference to FIG. 16.

As shown in FIG. 16, according to the sixth embodiment, a display part 65a is provided on a substrate 1d. Each of pixels 60a arranged in the shape of a matrix in the display part 65a comprises n-channel transistors 61a and 62a (referred to as transistors 61a and 62a hereinafter), a subsidiary capacitance 63a, an anode 64a and a cathode 65a, and an organic EL element 66a sandwiched between the anode 64a and the cathode 65a. A constitution for one pixel is shown in the display part 65a in FIG. 16. A source of the transistor 61a is connected to a gate of the transistor 62a and to one electrode of the subsidiary capacitance 63a. A drain thereof is connected to a drain line. A gate of the transistor 61a is connected to a gate line. A source of the transistor 62a is connected to the anode 64a and a drain thereof is connected to a current supplying line (not shown).

In addition, the circuit constitution in the H driver 3a is the same as that of the H driver 3a according to the third embodiment in the shift register circuit using the n-channel transistor shown in FIGS. 9 and 10. In addition, the circuit constitution in the V driver 5a is the same as that of the V driver 5a according to the fourth embodiment in the shift register circuit using the n-channel transistor shown in FIGS. 12 and 13. Constitution other than the above in the organic EL display according to the sixth embodiment is the same as the liquid crystal display according to the third embodiment shown FIG. 8.

According to the sixth embodiment, in the above constitution, there can be provided the same effects as in the third and fourth embodiments such that an increase in current consumption of the H driver and the V driver is prevented in the organic EL display.

In addition, the illustrated embodiments are thought to be illustrative and not restrictive in all respects. The scope of the present invention is not shown by the above description of the embodiments but shown by terms of the appended claims, and various kinds of variation is included in the same meaning and scope as in the claims.

For example, the present invention is not limited to the first to sixth embodiments, and it can be applied to a display other than a liquid crystal display and an organic EL display.

Furthermore, the present invention is not limited to the first to fourth embodiments and it can be applied to both shift register circuit of the H driver and shift register circuit of the V driver. In this case, an increase in power consumption is further prevented.

In addition, the present invention is not limited to the first and third embodiments and a signal other than the output signal of the next stage of shift register circuit and the output signal of the former stage of shift register circuit may be used as long as the period of on-state of the fourth transistor turned on in response to the first signal and the period of on-state of the eighth transistor turned on in response to the second signal do not over lap with each other. Even in this constitution, when the third transistor constituting the H driver is in on state, the fourth transistor can be turned off, and when the fourth transistor is in on state, the third transistor can be turned off. Furthermore, when the seventh transistor constituting the H driver is in on state, the eighth transistor can be turned off, and when the eighth transistor is in on state, the seventh transistor can be turned off.

Still further, the present invention is not limited to the second and fourth embodiments and a signal other than the output signal of the fourth circuit part of the same stage of shift register circuit and the output signal of the fourth circuit part of the former stage of shift register circuit may be used as long as the period of on state of the fourth transistor turned on in response to the first signal and the period of on state of the eighth transistor turned on in response to the second signal do not overlap with each other.

Still further, the present invention is not limited to the second and the fourth embodiments and a signal other than the output signal of the second circuit part of the next stage of shift register circuit and the output signal of the second circuit part of the same stage of shift register circuit may be used as long as the period of on state of the fourth transistor turned on in response to the first signal and the period of on state of the eighth transistor turned on in response to the second signal do not overlap with each other.

What is claimed is:

1. A display provided with a shift register circuit including a first circuit part comprising:
   a first conductive type of first transistor connected to a first potential side and turned on in response to a clock signal;
   a first conductive type of second transistor connected to a second potential side; a first conductive type of third transistor connected between a gate of said first transistor and said second potential; and
   a first conductive type of fourth transistor connected between a clock signal line and the gate of said first transistor and turned on in response to a first signal to supply said clock signal to said first transistor, and
   a second circuit part comprising:
   a first conductive type of fifth transistor connected to said first potential side and turned on in response to said clock signal;
   a first conductive type of sixth transistor connected to said second potential side;
   a first conductive type of seventh transistor connected between a gate of said fifth transistor and said second potential; and
   a first conductive type of eighth transistor connected between said clock signal line and the gate of said fifth transistor and turned on in response to a second signal by which a period of on state which does not overlap with a period of on state of said fourth transistor to which said first signal is input is obtained, to supply said clock signal to said fifth transistor.

2. The display according to claim 1, wherein
said shift register circuit is provided in the plural number of stages,
said first signal is an output signal of the next stage of said shift register circuit, and
said second signal is an output signal of the former stage of said shift register circuit.

3. The display according to claim 2, wherein
said shift register circuit comprises a shift register circuit for driving a drain line to which a picture signal is supplied.

4. The display according to claim 1, wherein
said shift register circuit comprises plural stages of shift register circuits each of which includes a first set of circuit parts consisting of said first circuit part and said second circuit part, and a second set of circuit parts connected to an output part of said first set of circuit parts, consisting of said first circuit part and said second circuit part and to which an output of the shift register is output,
said first signal input to the said second set of circuit parts is an output signal of said first set of circuit pars of the next stage of said shift register circuit, and
said second signal input to said second set of circuit parts is an output signal of said first set of circuit parts of the same stage of said shift register circuit.

5. The display according to claim 4, wherein
said shift register circuit comprises a shift register circuit for driving a gate line connected to the gate of the transistor provided in a display pixel.

6. The display according to claim 1, wherein
said third transistor is turned on in response to said second signal, and said seventh transistor is in off state while said eighth transistor turned on in response to said second signal is in on state.

7. The display according to claim 6, wherein
a gate of said third transistor and a gate of said eighth transistor are connected to an output of the former stage of said shift register circuit.

8. The display according to claim 6, wherein
a gate of said seventh transistor is connected to an output of said first circuit part.

9. The display according to claim 1, wherein said
third transistor has a function of turning said first transistor off when said second transistor is in on state, and
said seventh transistor has a function of turning said fifth transistor off when said sixth transistor is in on state.

10. The display according to claim 1, wherein
a first capacitor is connected between the gate and a source of said first transistor, and
a second capacitor is connected between the gate and a source of said fifth transistor.

11. The display according to claim 1, wherein
a first diode is connected between the gate of said first transistor and the clock signal line for supplying said clock signal and
a second diode is connected between the gate of said fifth transistor and the clock signal line for supplying said clock signal.

12. The display according to claim 11, wherein
said first diode comprises a diode-connected first conductive type of ninth transistor, and
said second diode comprises a diode-connected first conductive type of tenth transistor.

13. The display according to claim 12, wherein
said ninth transistor and said tenth transistor are p-type field effect transistors.

14. The display according to claim 1, wherein
at least said first transistor, said second transistor, said third transistor, said fourth transistor, said fifth transistor, said sixth transistor, said seventh transistor and said eighth transistor are p-type field effect transistors.

15. The display according to claim 1, wherein
a high resistance is connected between the eighth transistor of said second circuit part and said clock signal line.

16. The display according to claim 1, wherein
said shift register circuit comprises at least one of the shift register circuit for driving a drain line to which a picture signal is supplied and the shift register circuit for driving a gate line connected to the gate of the transistor provided in a display pixel.

17. The display according to claim 16, wherein
said display pixel comprises either a liquid crystal or an EL element.

* * * * *